United States Patent
Degner et al.

(10) Patent No.: US 9,829,932 B2
(45) Date of Patent: Nov. 28, 2017

(54) PORTABLE COMPUTING DEVICE

(71) Applicant: Apple Inc., Cupertino, CA (US)

(72) Inventors: Brett W. Degner, Menlo Park, CA (US); Euan Abraham, Sunnyvale, CA (US); John M. Brock, San Carlos, CA (US); Matthew P. Casebolt, Fremont, CA (US); Robert L. Coish, Mountain View, CA (US); Laura M. DeForest, San Mateo, CA (US); Michelle Goldberg, Sunnyvale, CA (US); Bradley Joseph Hamel, Sunnyvale, CA (US); Ron Hopkinson, Campbell, CA (US); Jim Hwang, Danville, CA (US); Caitlin E. Kalinowski, San Francisco, CA (US); Steven Keiper, San Jose, CA (US); Patrick Kessler, San Francisco, CA (US); Eugene Kim, San Francisco, CA (US); Chris Ligtenberg, San Carlos, CA (US); Jay K. Osborn, Dublin, CA (US); John Raff, Menlo Park, CA (US); Nicholas A. Rundle, San Jose, CA (US); David J. Yeh, Redwood City, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/593,930

(22) Filed: Jan. 9, 2015

(65) Prior Publication Data

US 2015/0131220 A1 May 14, 2015

Related U.S. Application Data

(63) Continuation of application No. 13/613,253, filed on Sep. 13, 2012, now Pat. No. 8,995,115, which is a
(Continued)

(51) Int. Cl.
H05K 7/00 (2006.01)
H05K 5/00 (2006.01)
(Continued)

(52) U.S. Cl.
CPC .............. G06F 1/181 (2013.01); F16B 35/06 (2013.01); F16B 41/005 (2013.01);
(Continued)

(58) Field of Classification Search
CPC ........................................................ G06F 1/16
(Continued)

(56) References Cited

U.S. PATENT DOCUMENTS 5,278,725 A 1/1994 Konno et al.
5,283,862 A 2/1994 Lund
(Continued)

FOREIGN PATENT DOCUMENTS

CN 1462839 12/2003
CN 200947187 9/2007
(Continued)

OTHER PUBLICATIONS

European Patent Application No. 11834787—Supplementary European Search Report dated Mar. 11, 2015.
(Continued)

*Primary Examiner* — Jerry Wu
(74) *Attorney, Agent, or Firm* — Brownstein Hyatt Farber Schreck, LLP

(57) ABSTRACT

A portable computing device includes at least a base portion of a lightweight material that includes at least a wedge shaped top case having a trough formed at an interfacing edge thereof. The trough includes a raised portion having a first contact surface and a receiving area, and a bottom case coupled to the top case to form a complete housing for at least a portion of the portable computing device for enclos-
(Continued)

ing at least a plurality of operational components and a plurality of structural components. The portable computing device also includes at least a lid portion pivotally connected to the base portion by a hinge assembly. In the described embodiments, the lid portion has a display in communication with one or more of the plurality of components in the base portion by way of or more electrical conductors that electrically connect the base portion to the lid portion.

12 Claims, 35 Drawing Sheets

Related U.S. Application Data continuation of application No. 13/339,325, filed on Dec. 28, 2011, now Pat. No. 8,339,775, which is a continuation of application No. 13/276,015, filed on Oct. 18, 2011, now abandoned, said application No. 13/339,325 is a continuation-in-part of application No. PCT/US2011/047796, filed on Aug. 15, 2011, which is a continuation of application No. 12/894,437, filed on Sep. 30, 2010, now Pat. No. 8,317,542.

(60) Provisional application No. 61/275,724, filed on Oct. 19, 2010, provisional application No. 61/394,037, filed on Oct. 18, 2010.

(51) Int. Cl.
   G06F 1/18   (2006.01)
   G06F 1/16   (2006.01)
   F16B 35/06  (2006.01)
   F16B 41/00  (2006.01)
   H05K 5/02   (2006.01)

(52) U.S. Cl.
   CPC .......... G06F 1/1616 (2013.01); G06F 1/1658 (2013.01); G06F 1/1662 (2013.01); G06F 1/1684 (2013.01); G06F 1/187 (2013.01); H05K 5/0008 (2013.01); H05K 5/0217 (2013.01); Y10T 29/49002 (2015.01)

(58) Field of Classification Search
   USPC .................................................... 361/679.01
   See application file for complete search history.

(56) References Cited

U.S. PATENT DOCUMENTS

| | | |
|---|---|---|
| 5,325,984 A | 7/1994 | Ady et al. |
| 5,355,278 A | 10/1994 | Hosoi et al. |
| 5,689,400 A | 11/1997 | Ohgami et al. |
| 6,262,886 B1 | 7/2001 | DiFonzo et al. |
| 6,347,035 B1 | 2/2002 | Hamano et al. |
| 6,367,358 B1 | 4/2002 | Stacy |
| 6,392,880 B1 | 5/2002 | Forlenza et al. |
| 6,404,623 B1* | 6/2002 | Koshika .................. G06F 1/165 345/87 |
| 6,437,773 B1 | 8/2002 | Kornmayer et al. |
| 6,661,650 B2 | 12/2003 | Nakajima et al. |
| 7,495,896 B2 | 2/2009 | Chen et al. |
| 7,499,040 B2 | 3/2009 | Zadesky et al. |
| 7,564,215 B2 | 7/2009 | Wang et al. |
| 2002/0043608 A1* | 4/2002 | Nakata .................... F16F 1/025 248/560 |
| 2003/0158555 A1 | 8/2003 | Sanders et al. |
| 2003/0184894 A1* | 10/2003 | Bischof ............... H04M 1/0266 359/894 |
| 2004/0027341 A1 | 2/2004 | Derocher |
| 2005/0057525 A1 | 3/2005 | Sun |
| 2005/0259069 A1 | 11/2005 | Baker et al. |
| 2006/0046787 A1 | 3/2006 | Zhu et al. |
| 2006/0061433 A1 | 3/2006 | Matsumoto |
| 2006/0146031 A1 | 7/2006 | Wang et al. |
| 2008/0174941 A1 | 7/2008 | Mundt et al. |
| 2008/0218953 A1 | 9/2008 | Yun et al. |
| 2008/0316691 A1 | 12/2008 | Arends |
| 2009/0037652 A1 | 2/2009 | Yu et al. |
| 2009/0058687 A1 | 3/2009 | Rothkopf et al. |
| 2009/0135579 A1 | 5/2009 | Kim et al. |
| 2009/0140996 A1 | 6/2009 | Takashima et al. |
| 2009/0154094 A1 | 6/2009 | Goto et al. |
| 2009/0160786 A1 | 6/2009 | Finnegan |
| 2009/0179537 A1 | 7/2009 | Morino et al. |
| 2009/0249245 A1 | 10/2009 | Watanabe |
| 2009/0257184 A1 | 10/2009 | Lee et al. |
| 2009/0272639 A1* | 11/2009 | Mittleman ............. H01H 13/79 200/345 |
| 2010/0001956 A1 | 1/2010 | Choi |
| 2010/0067278 A1 | 3/2010 | Oh et al. |
| 2010/0079404 A1 | 4/2010 | Degner et al. |
| 2010/0091442 A1 | 4/2010 | Theobald et al. |
| 2010/0092845 A1 | 4/2010 | Spare et al. |
| 2010/0103127 A1* | 4/2010 | Park .................... G06F 3/04886 345/173 |
| 2010/0107238 A1* | 4/2010 | Stedman ................. G06F 21/32 726/13 |
| 2010/0147581 A1 | 6/2010 | Mitomi |
| 2010/0259891 A1 | 10/2010 | Tachikawa |
| 2011/0021054 A1 | 1/2011 | Huang |
| 2011/0061067 A1 | 3/2011 | Negoro et al. |
| 2011/0075336 A1 | 3/2011 | Chiang et al. |
| 2011/0141052 A1* | 6/2011 | Bernstein ................ G06F 3/016 345/174 |
| 2011/0242756 A1 | 10/2011 | Degner et al. |
| 2013/0250205 A1 | 9/2013 | Ogatsu |

FOREIGN PATENT DOCUMENTS

| | | |
|---|---|---|
| CN | 101077025 | 11/2007 |
| CN | 201315050 | 9/2009 |
| CN | 101727976 | 6/2010 |
| CN | 202453764 | 9/2012 |
| EP | 1919267 | 5/2008 |
| EP | 2202619 | 6/2010 |
| JP | 6149410 | 5/1994 |
| JP | H09081271 A | 3/1997 |
| JP | H1146070 | 2/1999 |
| JP | 2004158892 | 6/2004 |
| JP | 2004179094 A | 6/2004 |
| JP | 2005063107 | 3/2005 |
| JP | 2006092803 | 4/2006 |
| JP | 2006134243 | 5/2006 |
| JP | 2007087800 A | 4/2007 |
| JP | 2008225980 | 9/2008 |
| JP | 2009059285 | 3/2009 |
| JP | 2009193859 | 8/2009 |
| JP | 2009245376 | 10/2009 |
| JP | 2009295190 | 12/2009 |
| JP | 2010049316 | 3/2010 |
| JP | 2010086236 | 4/2010 |
| KR | 1020090109862 | 10/2009 |
| KR | 1020100039363 | 4/2010 |
| TW | 413748 B | 12/2000 |
| TW | M377644 | 4/2010 |

OTHER PUBLICATIONS

"MacBook Air Presentation" dated Jul. 27, 2009, XPO054975894, Retrieved from the Internet: URL:httpps://www.youtube.com/watch?v=04IQvHYoJTE.

"Steve jobs introduces new MacBook trackpad—2008" dated Oct. 15, 2008, XPO54975896, Retrieved from the Internet: URL: https://www.youtube.com/watch?v=Znq2-CT7VRk.

European Patent Application No. 11834786.3—Supplementary European Search Report dated Jun. 11, 2015.

Australian Application No. 2011101053—Letter certifying application dated Dec. 7, 2011.

(56) References Cited

OTHER PUBLICATIONS

Australian Application No. 2011101053—First Office Acton dated Sep. 27, 2011.
Chinese Application No. CN201120381530.7—Office Action dated Feb. 27, 2012.
Chinese Application for invention No. 201180054844.9—First Office Action dated Feb. 4, 2015.
http://www.gadgetfolder.com/new-mini-sata-for-notebooks-and-first-toshiba-ssd-with-msata.htm., published Sep. 22, 2009 http://web-archive.org/web20091028162341/http://www.gadgetfolder.com/new-mini-sata-for-notebooks-and-first-toshiba-ssd-with-msata.html, (archived on Oct. 2009).
Chinese Application for invention No. 201110303561.5—Second Office Action dated Aug. 12, 2014.
"Intel X18-M/X25-M SATAT Solid State Drive Product Manual" dated May 31, 2009, 28 pages.
PCT Application No. PCT/US2011/047803—International Search Report and Written Opinion dated Mar. 9, 2012.
PCT Application No. PCT/US2011/047796—International Search Report and Written Opinion dated Mar. 23, 2012.
PCT Application No. PCT/US2011/047804—International Search Report and Written Opinion dated Mar. 19, 2012.
Japanese Patent Application No. 2013-533850—First Office Action dated Apr. 18, 2014.
Mexican Patent Application No. MX/a/2013/004376—Office Action dated May 12, 2014.
Chinese Application for invention No. 201110303561.5—First Office Action dated Feb. 12, 2014.
Chinese Application for invention No. 201180050212.5—First Office Action dated Aug. 6, 2015.
Chinese Application for invention No. 201310086611.8—Second Office Action dated Nov. 24, 2014.
Chinese Application for invention No. 201310086611.8—Third Office Action dated Jun. 11, 2015.
Chinese Application for invention No. 201110303561.5—Third Office Action dated Nov. 15, 2014.
Australian Patent Application No. 2015201399—Patent Examination Report No. 1 dated Feb. 19, 2016.
Chinese Application for Invention No. 201180050212.5—Second Office Action dated Mar. 23, 2016.
Japanese Patent Application No. 2013-531583—Final Rejection dated Oct. 7, 2015.

\* cited by examiner

Rear view

Front view

Left view

Right view

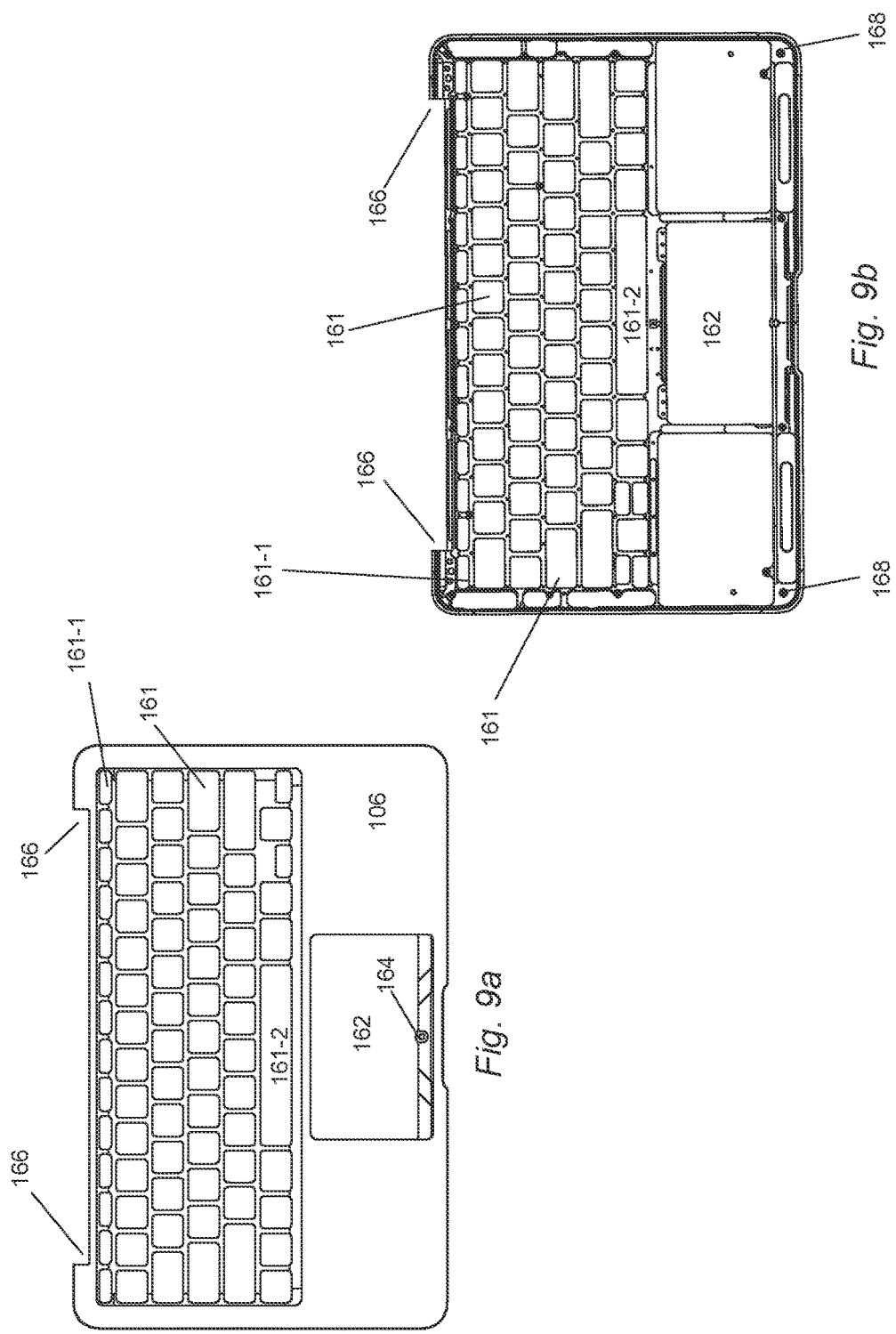

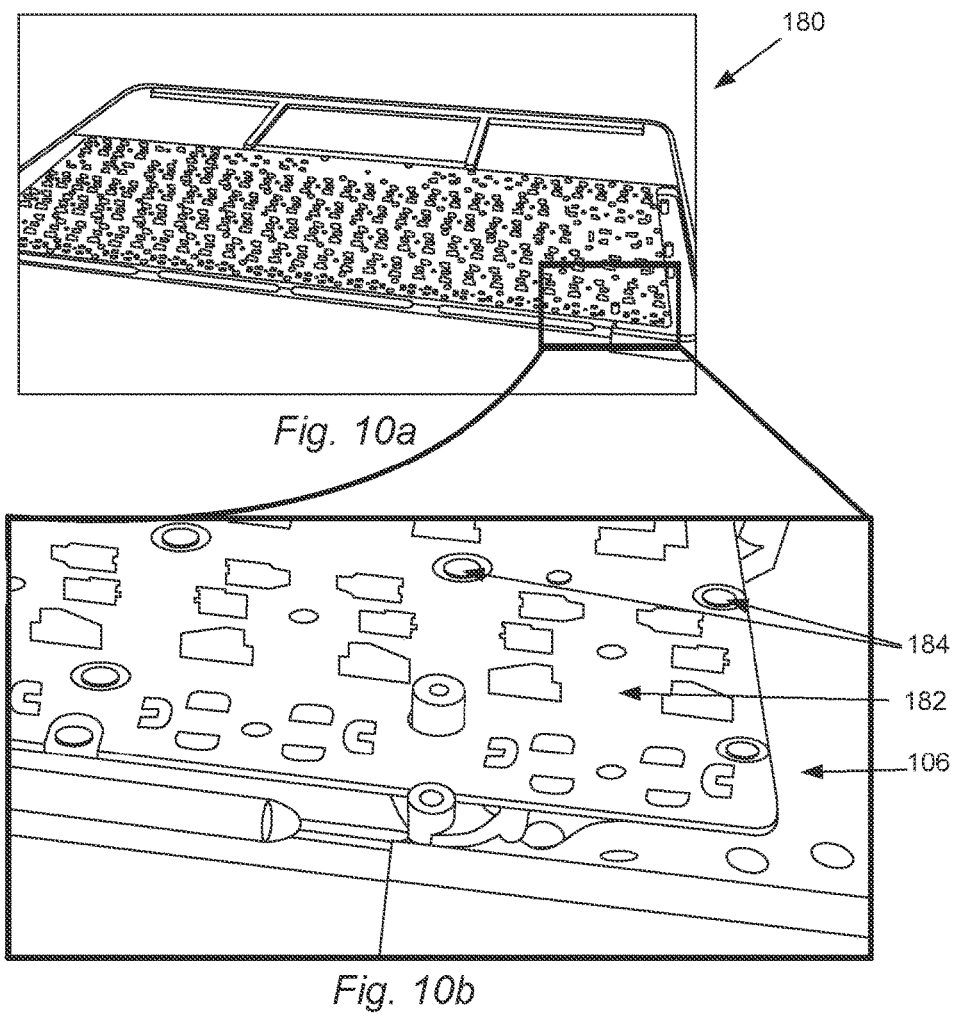
Fig. 10a
Fig. 10b
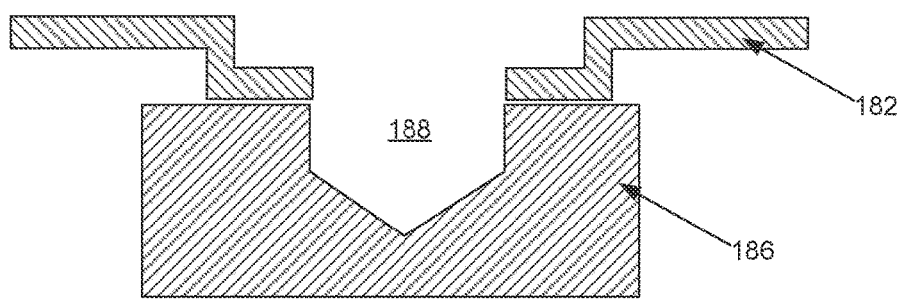
Fig. 10c

Section A-A

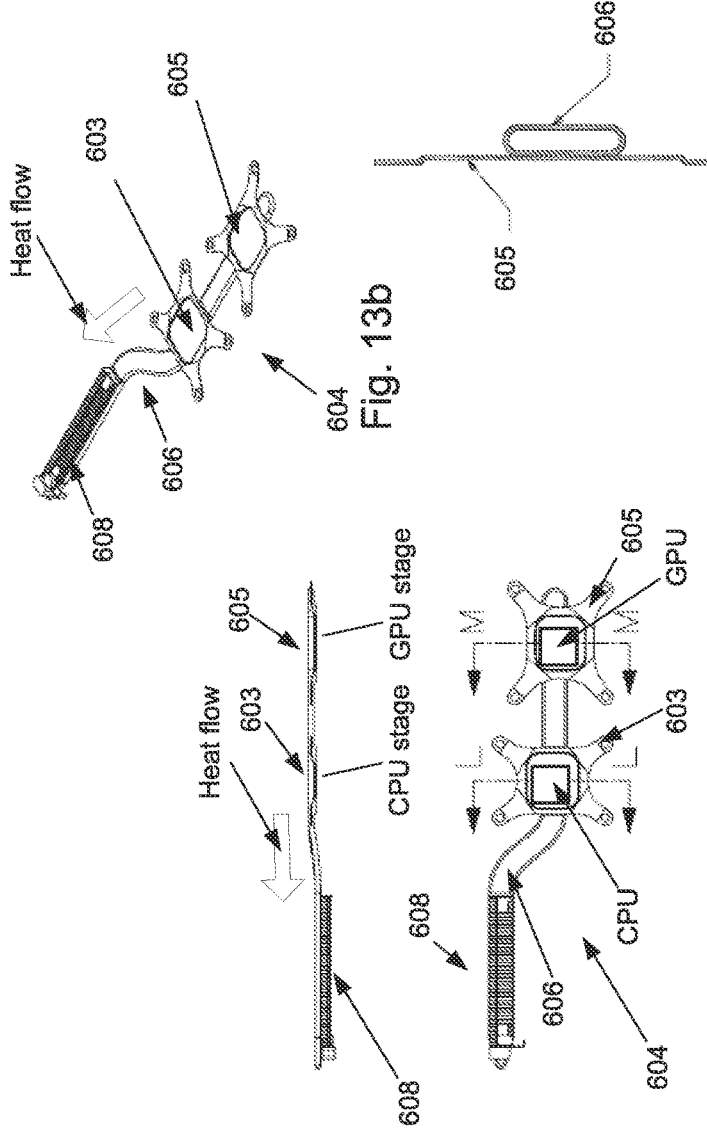
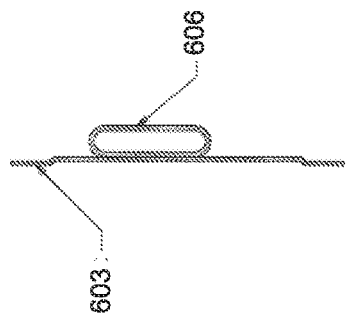
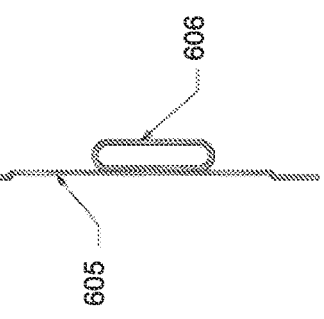

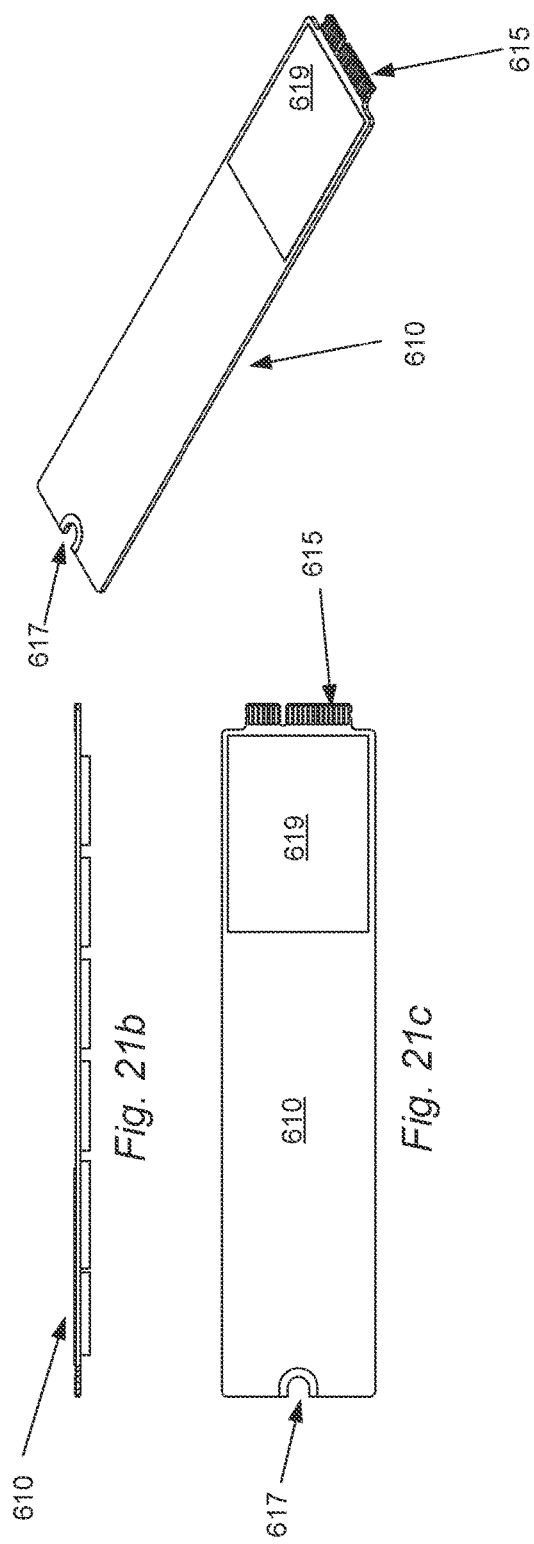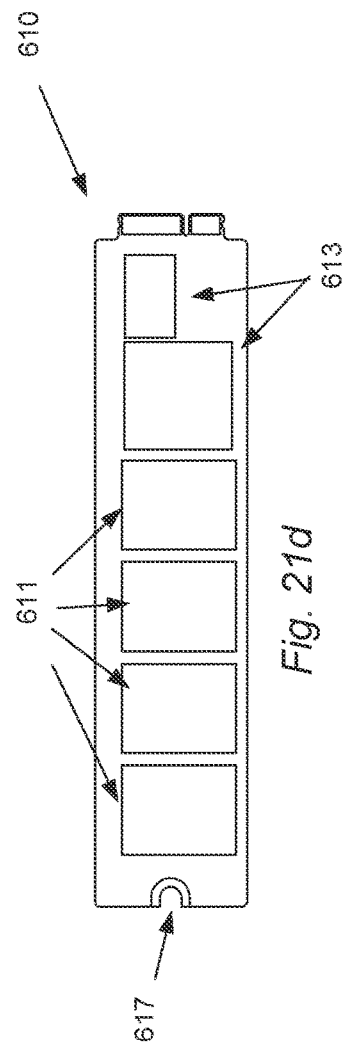

PORTABLE COMPUTING DEVICE

CROSS REFERENCE TO RELATED APPLICATIONS

This patent application is a continuation of U.S. application Ser. No. 13/613,253, filed Sep. 13, 2012, which is a continuation of U.S. patent application Ser. No. 13/339,325, filed Dec. 28, 2011 (now U.S. Pat. No. 8,339,775), which is a continuation in part of PCT Application No. PCT/US11/47796 filed Aug. 15, 2011, which in turn claims priority to U.S. patent application Ser. No. 12/894,437 (now U.S. Pat. No. 8,317,542), filed Sep. 30, 2010, entitled "HIGH SPEED CARD CONNECTOR" by Abraham, and is a continuation of U.S. application Ser. No. 13/276,015, filed Oct. 18, 2011, which claims priority to:

(i) U.S. Provisional Patent Application No. 61/394,037 filed Oct. 18, 2010 by Degner et al.; and
(ii) U.S. Provisional Patent Application No. 61/275,724 filed Oct. 19, 2010 by Degner et al.

This patent application is also related to and incorporates by reference in their entireties and for all purposes the following co-pending patent applications:

(i) U.S. patent application Ser. No. 12/714,737 (now U.S. Pat. No. 8,518,569) entitled "INTEGRATED FRAME BATTERY CELL" by Murphy et al., and filed Mar. 1, 2010;
(ii) U.S. patent application Ser. No. 12/552,857 (now U.S. Pat. No. 8,398,380) entitled "CENTRIFUGUAL BLOWER WITH NON-UNIFORM BLADE SPACING" by Duke, and filed Sep. 2, 2009;
(iii) U.S. patent application Ser. No. 12/620,299 (now U.S. Pat. No. 8,305,761) entitled "HEAT REMOVAL IN COMPACT COMPUTING SYSTEMS" by Degner et al., and filed Nov. 17, 2009;
(iv) U.S. patent application Ser. No. 12/580,922 (now U.S. Pat. No. 8,111,505) entitled "COMPUTER HOUSING" by Raff et al., and filed Oct. 16, 2009; and
(v) U.S. patent application Ser. No. 12/712,102 entitled "STACKED METAL AND ELASTOMERIC DOME FOR KEY SWITCH" by Niu et al., and filed Feb. 24, 2010.

TECHNICAL FIELD

The present invention relates generally to portable computing devices. More particularly, the present embodiments relate to enclosures of portable computing systems and methods of assembling portable computing devices.

BACKGROUND

The outward appearance of a portable computing system, including its design and its heft, is important to a user of the portable computing system, as the outward appearance contributes to the overall impression that the user has of the portable computing system. At the same time, the assembly of the portable computing system is also important to the user, as a durable assembly will help extend the overall life of the portable computing system and will increase its value to the user.

One design challenge associated with the manufacture of portable computing systems is the design of the outer enclosures used to house the various internal computing components. This design challenge generally arises from a number conflicting design goals that include the desirability of making the outer enclosure or housing lighter and thinner, of making the enclosure stronger, and of making the enclosure aesthetically pleasing, among other possible goals. Lighter housings or enclosures tend to be more flexible and therefore have a greater propensity to buckle and bow, while stronger and more rigid enclosures tend to be thicker and carry more weight. Unfortunately, increased weight may lead to user dissatisfaction with respect to reduced portability, while bowing may damage internal parts or lead to other failures. Further, few consumers desire to own or use a device that is perceived to be ugly or unsightly. Due to such considerations, portable computing system enclosure materials are typically selected to provide sufficient structural rigidity while also meeting weight constraints, with any aesthetic appeal being worked into materials that meet these initial criteria.

As such, outer enclosures or housings for portable computing systems are often made from aluminum, steel and other inexpensive yet sturdy metals having a suitable thickness to achieve both goals of low weight and high structural rigidity. The uses of metal enclosures is also convenient from the standpoint of providing a ready electrical ground and/or a ready radio frequency ("RF") or electromagnetic interference ("EMI") shield for the processor and other electrical components of the computing device, since a metal enclosure or outer housing can readily be used for such functions.

Therefore, it would be beneficial to provide portable computing system that is aesthetically pleasing and lightweight, and durable. It would also be beneficial to provide methods for assembling the portable computing system.

SUMMARY

The present application describes various embodiments regarding systems and methods for providing a lightweight and durable portable computing device having a wedge shaped profile and an associated high speed memory card and card connector. This can be accomplished at least in part through the use of a wedge shaped outer housing and specially designed inner components arranged to fit and operate within this housing. Such components include a high speed memory card and associated card connector that utilizes contacts having short signal paths, as well as a ground plane split into multiple portions. In one aspect of the provided embodiments, the computing device takes the form of a laptop computer.

In various embodiments, a portable computing device can include a base portion formed from a lightweight material and including a wedge shaped top case coupled to a bottom case to form a complete housing for at least a portion of the portable computing device, the complete housing enclosing at least a plurality of operational components and a plurality of structural components. The portable computing device can also include a lid portion pivotally connected to the base portion by a hinge assembly, the lid portion having a display in communication with one or more of the components in the base portion.

The hinge assembly can have one or more electrical conductors that electrically couple the lid portion to the base portion, and can also include a hollow clutch having an annular outer region and a central bore region surrounded by the annular outer region. The central bore region permits the passage of and provides support for the one or more electrical conductors. The hinge assembly can also include a first fastening component that facilitates the coupling of the hollow clutch to the base portion, and also a second fastening component that facilitates the coupling of the hollow clutch to the lid portion, wherein at least one of the first and second fastening components is integrally formed with the hollow clutch.

In various, embodiments, the portable computing device, which can be a laptop computer, can also include one or more user input components located on the base portion, with the base portion defining a wedge shape such that the one or more user input components are presented at an angle to a user of the portable computing device. The user inputs can include a keyboard, a touch pad, or both.

In various embodiments, the portable computing device can include as one of the operational components a laterally configured, small Z stack solid state memory device or module. In some embodiments, the memory module can be a stand alone device. The memory device or module can include a substrate, a plurality of memory devices arranged linearly on the substrate, and a controller linearly arranged in accordance with the plurality of the memory devices and arranged to provide control signals to the memory devices. This solid state memory device can include a set of eighteen contacts located along one edge of the substrate, the contacts being adapted to interface with a respective connector coupled to a motherboard of the portable computing device.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatuses and methods for providing portable computing devices. These drawings in no way limit any changes in form and detail that may be made to the invention by one skilled in the art without departing from the spirit and scope of the invention. The embodiments will be readily understood by the following detailed description in conjunction with the accompanying drawings, wherein like reference numerals designate like structural elements, and in which:

FIGS. 9a and 9b show an exterior view of top case illustrating various openings used to accommodate a keyboard and a touchpad in accordance with the described embodiments.

FIGS. 10a through 10c show a top case and feature plate assembly in accordance with the described embodiments.

FIGS. 13a through 13d show a representative compact thermal module in accordance with the described embodiments.

FIG. 18 shows representative cable secured by cable straps of FIG. 17a.

FIGS. 21a through 21d show an SSD memory module in perspective, side, bottom and top views respectively in accordance with the described embodiments.

DETAILED DESCRIPTION

Figure 1:
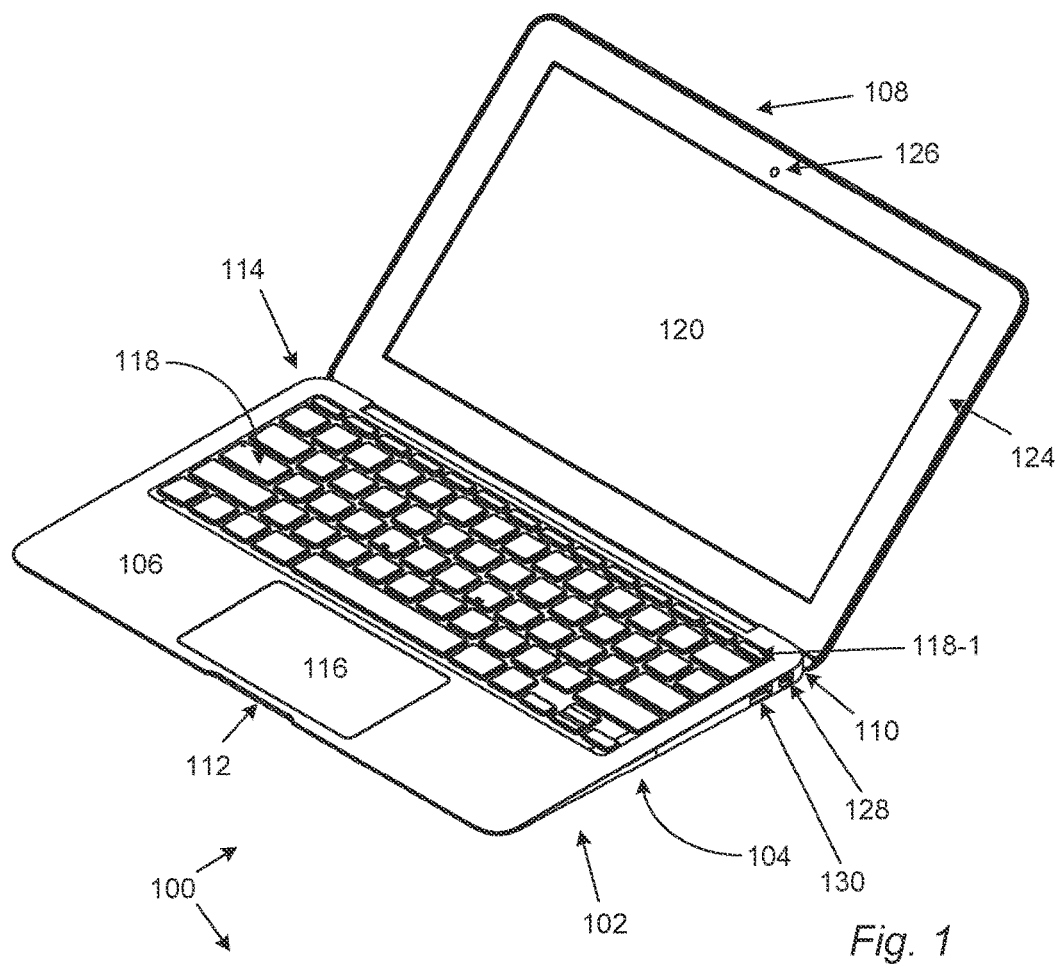
FIGS. 1-6 show representative views of a portable computing system in accordance with the described embodiments.

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

The following relates to a portable computing system such as a laptop computer, net book computer, tablet computer, etc. The portable computing system can include a multi-part housing having a top case and a bottom case joining at a reveal to form a base portion. The portable computing system can have an upper portion (or lid) that can house a display screen and other related components whereas the base portion can house various processors, drives, ports, battery, keyboard, touchpad and the like. The base portion can be formed of a multipart housing that can include top and bottom outer housing components each of which can be formed in a particular manner at an interlace region such that the gap and offset between these outer housing components are not only reduced, but are also more consistent from device to device during the mass production of devices. These general subjects are set forth in greater detail below.

In a particular embodiment, the lid and base portion can be pivotally connected with each other by way of what can be referred to as a hollow clutch assembly. The hollow clutch assembly can be arranged to pivotally couple the base portion to the lid. The hollow clutch assembly can include at least a hollow cylindrical portion that in turn includes an annular outer region, and a central bore region surrounded by the annular outer region, the central bore suitably arranged to provide support for electrical conductors between the base portion and electrical components in the lid. The hollow clutch assembly can also include a plurality of fastening regions that couple the hollow clutch to the base portion and the lid of the portable computing system with at least one of the fastening regions being integrally formed with the hollow cylindrical portion such that space, size/and part count are minimized.

The multipart housing can be formed of a strong and durable yet lightweight material. Such materials can include composite materials and or metals such as aluminum. Aluminum has a number of characteristics that make it a good choice for the multipart housing. For example, aluminum is a good electrical conductor that can provide good electrical ground and it can be easily machined and has well known metallurgical characteristics. Furthermore, aluminum is not highly reactive and non-magnetic which can be an essential requirement if the portable computing system has RF capabilities, such as WiFi, AM/FM, etc. In order to both protect the multipart housing and provide an aesthetically appealing finish (both visual and tactile), a protective layer can be placed or formed on an external surface of the multipart housing. The protective layer can be applied in such a way to both enhance the aesthetic appeal of the housing and to protect the appearance of the portable computing system. In one embodiment, when the multipart housing is formed of aluminum, at least an exterior surface of the aluminum, can be anodized to form the protective layer.

The top case can include a cavity, or lumen, into which a plurality of operational components can be inserted during an assembly operation. In the described embodiment, the operational components can inserted info the lumen and attached to the top case in an "top-bottom" assembly operation in which top most components are inserted first followed by components in a top down arrangement. For example, the top case can be provided and shaped to accommodate a keyboard module. The keyboard module can include a keyboard assembly formed of a plurality of keycap assemblies and associated circuitry, such as a flexible membrane on which can be incorporated a switching matrix. In one embodiment, the keycap assemblies can take the form of low profile keycaps such as described in U.S. patent application Ser. No. 12/712,102 entitled "STACKED METAL AND ELASTOMERIC DOME FOR KEY SWITCH" by Niu et al. which is incorporated by reference in its entirety.

In one embodiment, a keycap assembly can be used to replace a power switch. For example, in a conventional keyboard each of a top row of keycaps can be assigned at least one function. However, by re-deploying one of the keycaps as a power button, the number of operational components can be reduced by at least eliminating the switch mechanism associated with the conventional power button and replacing it with the already available keycap assembly and associated circuitry.

In addition to the keyboard, the portable computing system can include a touch sensitive device along the lines of a touch pad, touch screen, etc. In those embodiments where the portable computing device includes a touch pad the touch pad can be formed from a glass material. The glass material provides a cosmetic surface and is the primary source of structural rigidity for the touchpad. The use of the glass material in this way significantly reduces the overall thickness of the touchpad compared to previous designs. The touchpad can include circuitry for processing signals from both a sensor associated with the touchpad and a keyboard membrane associated with the keyboard. Thus, separate circuitry previously used to process the signals from the keyboard membrane is eliminated.

The touchpad includes a dome switch for detecting an actuation of the touch pad that is covered with a sealing mechanism. The dome switch can include an electrical switch. The sealing mechanism can protect the electrical switch from dirt and moisture intrusion and hence, improve the robustness of the electrical switch. The sealing mechanism can include expansion gaps into which the dome switch can expand when it is compressed. During actuation, the use of the expansion gaps improves the force feedback response associated with the dome switch and the overall aesthetic feel of the touch pad.

In the embodiments where at least one of the top case and bottom case are formed of conductive material, such as aluminum, a good electrical ground plane or electrical ground can be provided. The ability to provide a good ground plane can be particularly advantageous due to the close proximity of the operational components to one another in the portable computing system. Due to this close proximity, it is desirable to isolate sources of significant RF radiation (such as a main logic board, or MLB) from those circuits, such as wireless circuits, that are sensitive to RF interference. In this way, at least the conductive top and/or bottom case be used to provide a good chassis ground that, in turn, can be used to electromagnetically isolate the circuits that produce RF energy from those components that am sensitive to RF energy. Moreover, by forming both top and bottom case with conductive material, the top and bottom case can be joined to form a base portion that can act as a Faraday cage that can effectively shield the external environment from EMI generated by the portable computing system. The Faraday cage like attributes of the base portion can also protect RF sensitive components from externally generated EMI.

In order to provide a pleasing aesthetic to the user, the shape of the portable computing system can have a profile that is pleasing to the eye and to the touch. In the described embodiments, the multipart housing can have a wedge shape. The wedge shape can be such that when the bottom surface of the portable computing system is placed upon a flat supporting surface, such as a table or desk, the angle presented by the wedge shaped housing (in particular the wedge shaped upper portion of the multipart housing) can present an easy to use keyboard arrangement and touchpad. In contrast to conventional portable computing systems such as laptop computers having a uniformly shaped housing with little or no angularity, the wedge shape of the portable computing system can improve user interaction with the touch pad and keyboard by presenting the touch pad surface and the keycaps in a more natural alignment with a user's fingers. In this way, improved ergonomics can help reduce an amount of stress and strain placed upon the user's wrists.

Due at least to the strong and resilient nature of the material used to form the multipart housing; the multipart housing can include a number of openings having wide spans that do not require additional support structures. Such openings can take the form of ports that can be used to provide access to internal circuits. The ports can include, for example, data ports suitable for accommodating cables (USB, Ethernet, FireWire, etc.) connecting external circuits. The openings can also provide access to an audio circuit, video display circuit, power input, etc.

These and other embodiments are discussed below with reference to FIGS. 1-43. However, those skilled in the art will readily appreciate that the detailed description given herein with respect to these figures is for explanatory purposes as the invention extends beyond these limited embodiments.

Portable Computing Device

Figure 2:
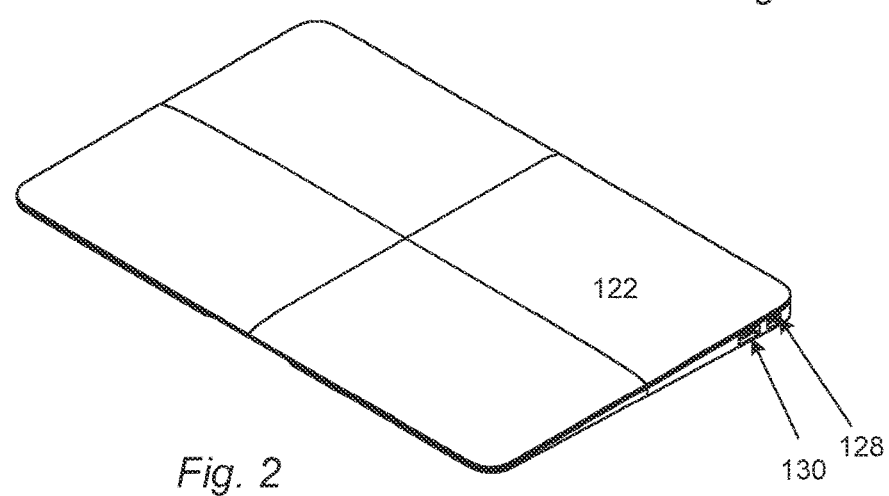

FIGS. 1-6 show various views of portable computing system 100 in accordance with the described embodiments. FIG. 1 shows a front facing perspective view of portable computing system 100 in an open (lid) state whereas FIG. 2 shows portable computing system 100 in a close (lid) state. Portable computing system 100 can include base portion 102 formed of bottom case 104 fastened to top case 106. Base portion 102 can be pivotally connected to lid portion 108 by way of hollow clutch assembly 110 hidden from view by a cosmetic wall. Base portion 102 can have an overall wedge shape having a first end sized to accommodate hollow clutch assembly 110. Base portion 102 can taper down to a more narrowly configured end arranged to accommodate inset portion 112 suitable for assisting a user in lifting lid portion 108 by, for example, a finger. In the described embodiment, the overall wedge shaped appearance of base portion 102 can be created by the overall wedge shape of top case 106. Alternatively, a wedge shaped bottom case could provide a similar result. Top case 106 can be configured to accommodate various user input devices such as keyboard 114 and touchpad 116. Keyboard 114 can include a plurality of low profile keycap assemblies each having an associated key pad 118.

Each of the plurality of key pads 118 can have a symbol imprinted thereon for identifying the key input associated with the particular key pad. Keyboard 114 can be arranged to receive a discrete input at each keypad using a finger motion referred to as a keystroke. In the described embodiment, the symbols on each key pad can be laser etched thereby creating an extremely clean and durable imprint that will not fade under the constant application of keystrokes over the life of portable computing system 100. Touch pad 116 can be configured to receive a user's finger gesturing. A finger gesture can include touch events from more than one finger applied in unison. The gesture can also include a single ringer touch event such as a swipe or a tap. In order to reduce component count, a keycap assembly can be re-provisioned as a power button. For example, key pad 118-1 can be used as power button 118-1. In this way, the overall number of components in portable computing system 100 can be commensurably reduced.

Lid portion 108 can include display 120 and rear cover 122 (shown more clearly in FIG. 2) that can add a cosmetic finish to lid portion 108 and also provide structural support to at least display 120. In the described embodiment, lid portion 108 can include display trim 124 that surrounds display 120. Lid portion 108 can be moved with the aid of hollow clutch assembly 110 from the closed position to remain in the open position and back again. Display 120 can display visual content such as a graphical user interface, still images such as photos as well as video media items such as movies. Display 120 can display images using any appropriate technology such as a liquid crystal display (LCD), OLED, etc. Portable computing system 100 can also include image capture device 126 located on display trim 124. Image capture device 126 can be configured to capture both still and video images. Display trim 124 can be supported by structural components (not shown) within lid portion 108 but attached to rear cover 122. Display trim 124 can enhance the overall appearance of display 120 by hiding operational and structural components as well as focusing attention onto the active area of display 120. Data ports 128 and 130 can be used to transfer data and/or power between an external circuit(s) and portable computing system 100. Lid portion 108 can be formed to have unibody construction that can provide additional strength and resiliency to lid portion 108 which is particularly important due to the stresses caused by repeated opening and closing. In addition to the increase in strength and resiliency, the unibody construction of lid portion 108 can reduce overall part count by eliminating separate support features.

Figure 3:
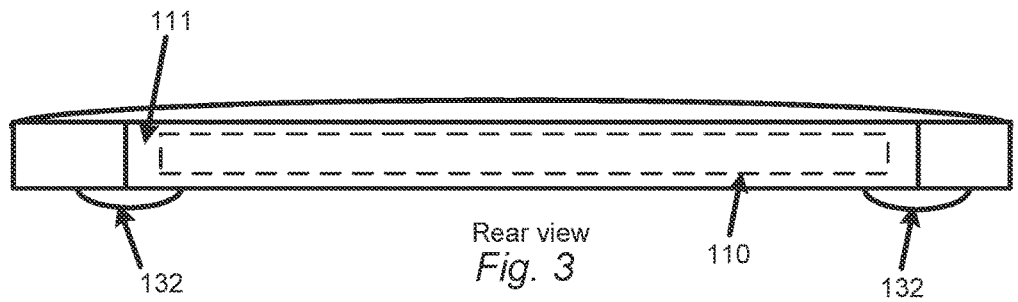
Figure 4:
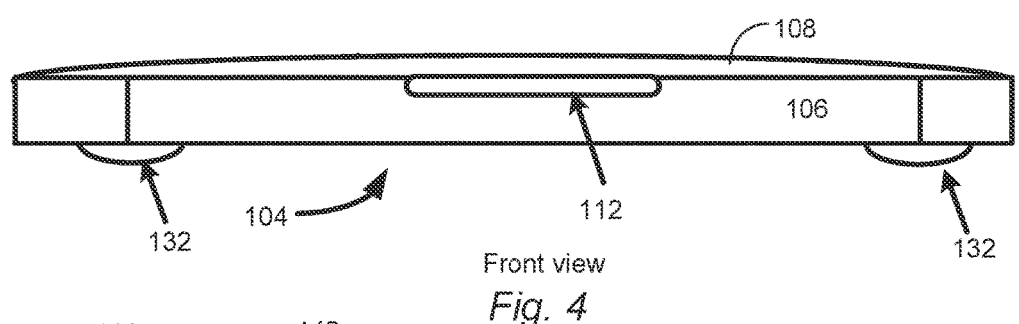
Figure 5:
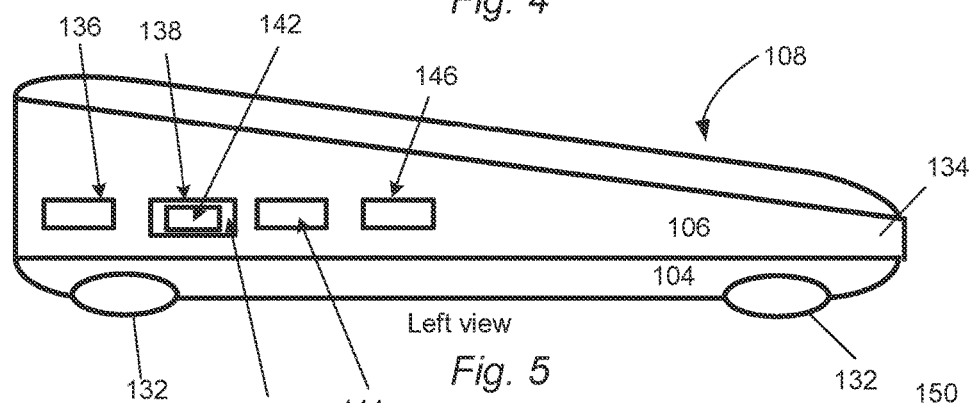
Figure 6:
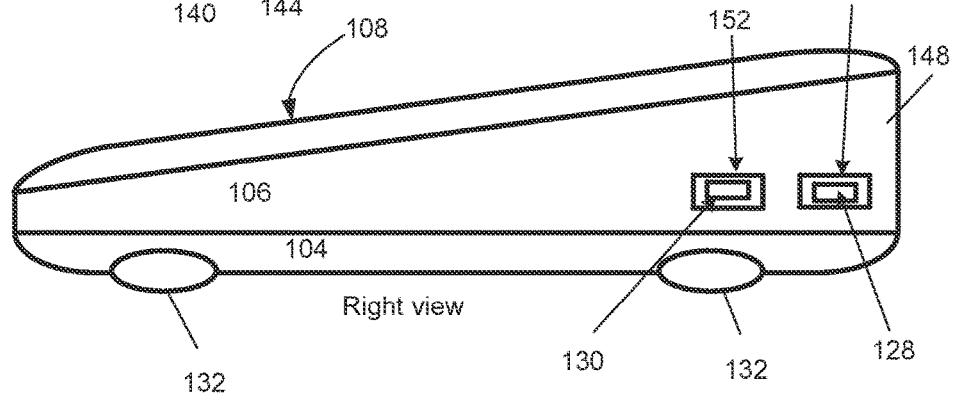

Turning now to FIGS. 3-6 showing side views of portable computing system 100. More specifically, FIG. 3 shows a rear view of portable computing system 100 showing cosmetic wall 111 used to conceal hollow clutch assembly 110 and at least two support feet 132 that can be used to provide support to portable computing system 100. Support feet 132 can be formed of wear resistant and resilient material such as plastic. FIG. 4 shows representative front view of portable computing system 100 illustrating the relative position of insert 112 between top case 106 and lid portion 108. As shown in FIG. 5 illustrating a representative left side view of portable computing system 100 showing left side wall 134 of top case 106 having openings that can be used to accommodate various data and power ports. For example, opening 136 formed in left side wall 134 can be used to accommodate an Ethernet cable whereas opening 138 can be used to accommodate Magsafe™ receptacle 140. It should be noted that opening 138 must have a high aspect ratio in order to accommodate receptacle 140 due in part to a relatively large platform 142, or mesa that allows an appropriately configured power plug to more easily align to receptacle 140. In the particular embodiments described herein, audio receptacle 144 and side firing microphone 146 can be positioned on side wall 134. As shown in FIG. 6, right side wall 148 of top case 106 can include openings 150 and 152 used to accommodate data ports 128 (such as a USB data port) and 130 that can take the form of, respectively, a video port such as a DisplayPort™ type video port.

Figure 7:
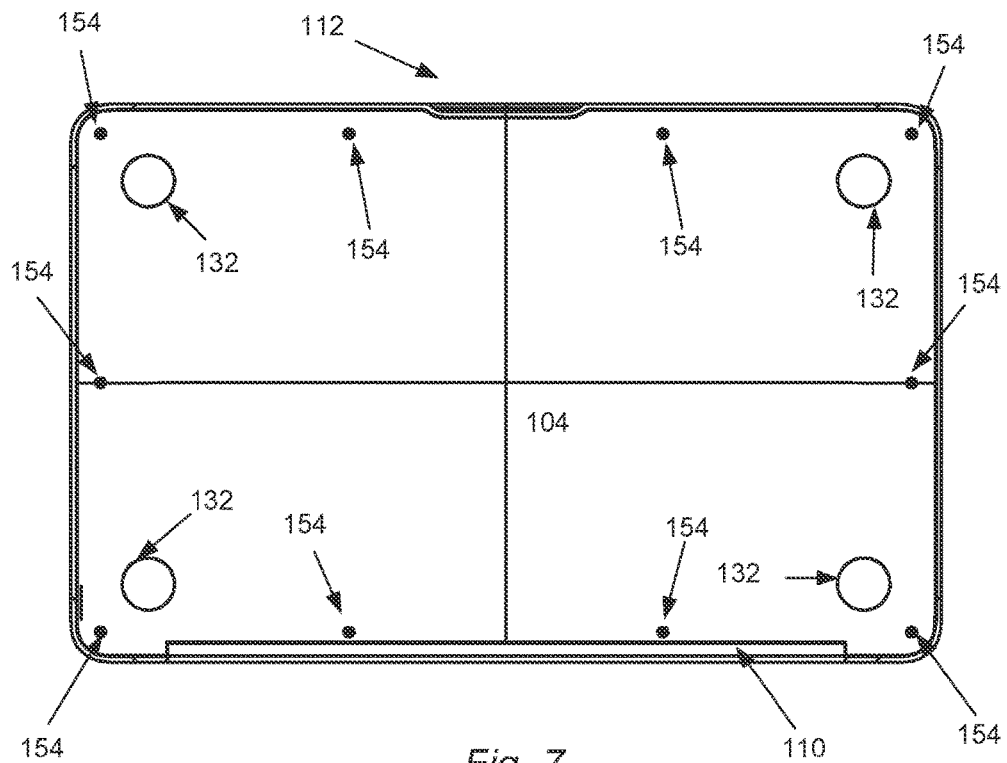
FIG. 7 shows an external view of a bottom case in accordance with the described embodiments.
Figure 8:
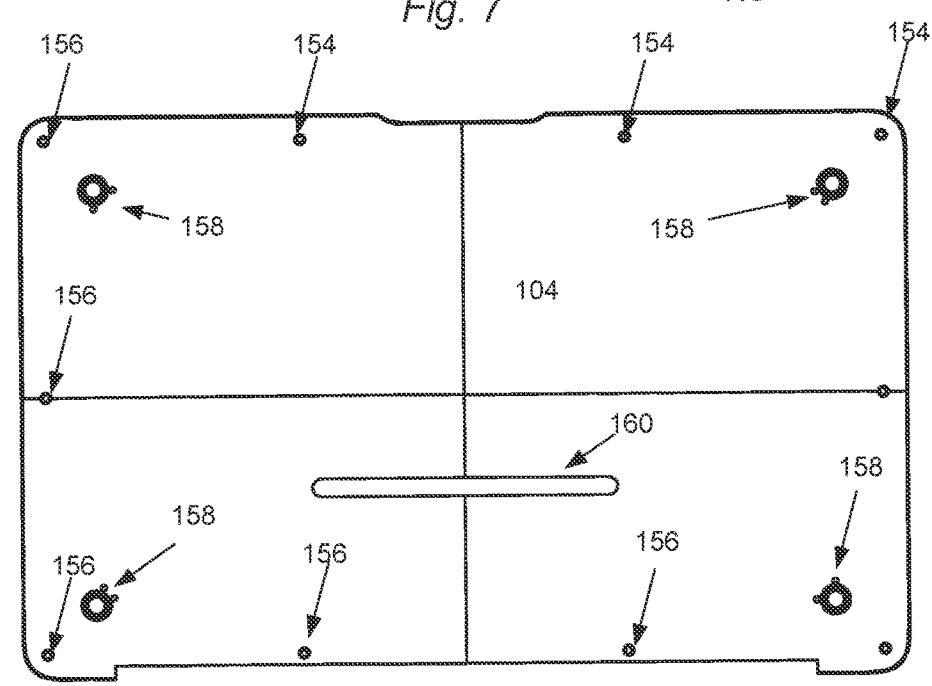
FIG. 8 shows an internal view of the bottom case shown in FIG. 7.

FIG. 7 shows an external view of bottom case 104 showing relative positioning of support feet 132, insert 112, exterior of hollow clutch assembly 110 and fasteners 154 used to secure bottom case 104 and top case 106 together. In the particular implementation described, fasteners 154 can take the form of tamper resistant fasteners described in more detail below. FIG. 8 shows an internal view of bottom case 104 showing openings 156 used to accommodate fasteners 154. Moreover, fasteners 158 can be used to secure device feet 132 to bottom case 104. Standoff 160 can be used to provide support for bottom case 104 when attached to top case 106.

FIGS. 9*a* and 9*b* show representative embodiments of top case 106. For example, FIG. 9*a* shows an exterior view of top case 106 illustrating various openings used to accommodate keyboard 114 and touch pad 116. More specifically, openings 161 can each have a size and shape in accordance with a specific key cap assembly. For example, opening 161-1 can be sized to accommodate power button 118-1 whereas opening 161-2 can be sized to accommodate a space bar. In addition to openings 161, opening 162 can accommodate touch pad 116. For example, opening 162 can include attachment feature 164 that can be used to secure the touchpad 116 to top case 100. Moreover, as seen in FIG. 9*b* showing the interior of top case 106, several additional attachment features can be seen that can be used to secure both touch pad 116 and keyboard 114. In a particular embodiment, keyboard 114 and touch pad 116 can share circuitry that can at least reduce an overall component count. In addition, notch 166 can be used in conjunction with hollow clutch assembly 110 to provide a more unified and integrated appearance to portable computing system 100. Attachment features 168 can be used to with opening 156 to secure bottom case 104 and top case 106.

FIGS. 10*a* through 10*c* show a top case and feature plate assembly 180. FIG. 10*a* shows the entire assembly 180 in obverse perspective view, while FIG. 10*b* is a close up view of a corner of the assembly. As shown in FIG. 10*b*, a feature plate 182 is fastened to top case 106 by way of numerous rivets 184. Numerous components can be disposed between the feature plate 182 and the top case 106, as will be readily appreciated. FIG. 10*c* depicts a partial cross section of one rivet location of feature plate assembly 180, which riveting is accomplished in a composite beam type manner. Feature plate 182, which can be a thin steel plate, for example, can be riveted at location 188 to an aluminum webbing 186 that is situated between various keycaps (not shown). Webbing 186 can in turn be coupled to top case 106, or can be integrally formed with the top case in some embodiments. Location 188 is preferably sized and shaped in order to accommodate a rivet that goes through a proximately placed location in feature plate 182.

Numerous advantages can be realized by way of having a feature plate 182 that is riveted to a top case 106 by way of multiple rivets 184 to enclose various internal components therein. For example, the combination of the top case 106 and a steel feature plate 182 can result in the creation of an effective EMI shield, and even a Faraday cage type shield in some embodiments. This EMI shielding effect is enhanced by the use of numerous fastening points held together by rivets, which tends to seal off the internal components of the keyboard better than when fewer fastening points are used, such as in a screw or bolt type arrangement. This EMI shield then effectively isolates the keyboard in an EMI sense from various other components in the computing device, such as the processor located directly below the keyboard or any antenna that may be at the device.

As another benefit, using a rivet rather than other types of fastening components, such as screws, bolts and the like results in no need for the fastening component to extend through the top case 106 or even the aluminum webbing 186 in order to affect a strong fastening of components. This is advantageous where a smooth and unbroken surface may be desired on the outside of the top case or aluminum webbing. This is also advantageous in that manufacturing riveting processes can be significantly faster than similar screwing or bolting processes, in that the obverse side of the components being riveted does not need to be accessed in some cases, such as that which is disclosed above. Another benefit that can be realized by using rivets instead of screws is that the overall assembly can be thinner, particularly since there is no longer a need to accommodate threaded structures or components, which can take up space.

While using rivets rather than screws or bolts tends to result in the need for a greater quantity of fastening components (i.e., rivets), since each rivet location tends to be weaker than each screw location in a similar assembly, this can be countered by using a composite beam type riveting arrangement for increased strength, and also a rapid riveting process to obtain the benefit of a smooth and unbroken obverse surface on one side of the assembly being riveted. The use of rivets rather than screws can lead to simpler manufacturing processes that tend to save costs, are faster, and can also result in the use of more fastening points, which in turn leads to greater integrity in components that are fastened together more reliably. The overall feel of a riveted together top case, keyboard and feature plate assembly is also improved by using rivets rather than screws, as the combination of components tends to be suffer, more stable, and more affixed together as an overall assembly.

Figure 11A:
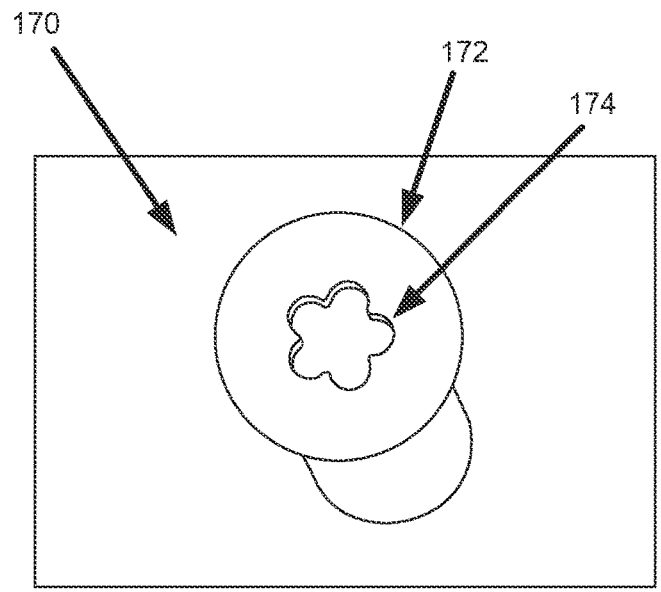
FIGS. 11a and 11b show an embodiment of a tamper resistant fastener that can be used to secure the top case and the bottom case of the portable computing device in accordance with the described embodiments.
Figure 11B:
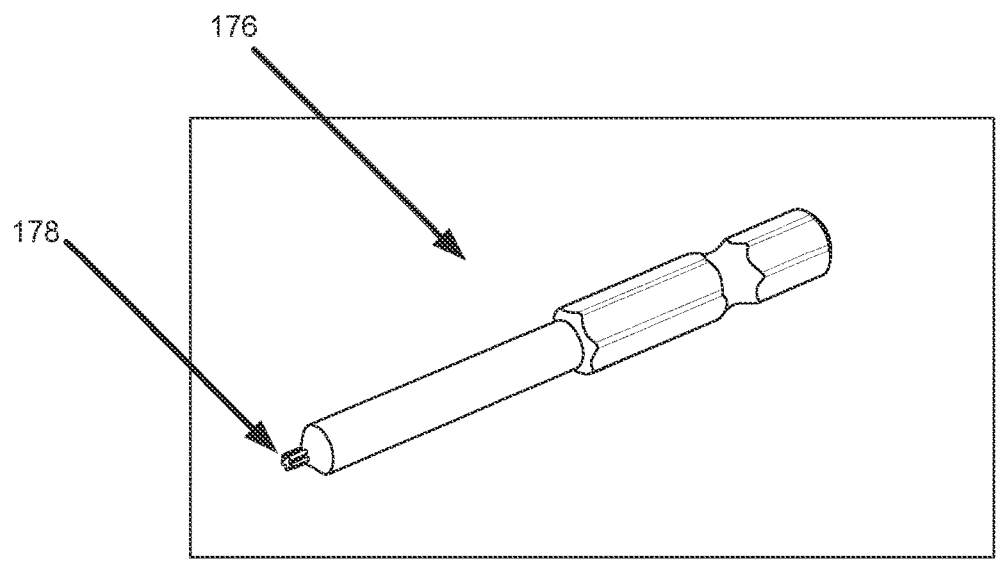

FIG. 11*a* shows an embodiment of fastener 154 in the form of tamper resistant fastener 170 that can be used to secure bottom case 104 and top case 106. In the described embodiments, tamper resistant fastener 170 can be formed to have head portion 172 that includes shaped recesses 174. The number and shape of recesses 174 can be widely varied. In this way, the only authorized mechanism by which tamper resistant fastener 170 can be engaged for insertion or removal is driver 176 shown in FIG. 11*b*. Driver 176 includes driver portion 178 shaped to correspond to shaped recesses 174. In the particular implementation shown in FIGS. 11*a* and 11*b*, tamper resistant fastener 170 can include five shaped recesses 174 (also referred to as lobes) such that tamper resistant fastener 170 can be referred to as pentalobe fastener 170. Therefore, in order to properly engage pentalobe listener 170, driver portion 178 of driver 176 must have a shape that conforms to that of pentalobes 174. In other words, driver portion 178 must be shaped and sized to coincide with the shape and size of pentalobes 174. Accordingly, only those individuals having access to authorize pentalobe driver 176 are capable of properly engaging pentalobe fastener 170. In this way, the use of an inappropriately shaped driver can be readily detected by way of the likely damage caused to pentalobe fastener 170.

Figure 12A:
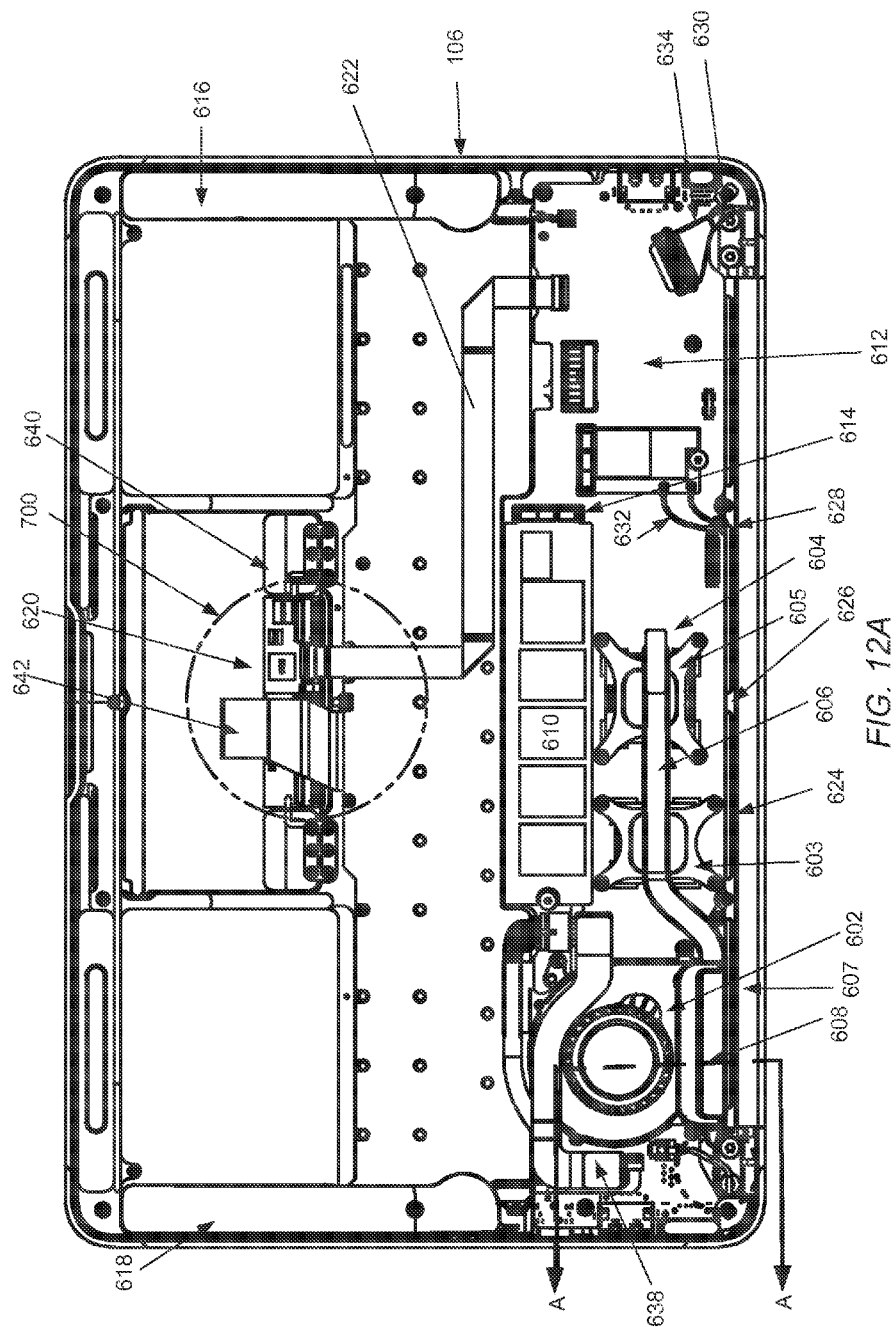
FIG. 12A, shows a portable computing system with a bottom case and the battery removed to reveal various internal components and structures
Figure 12B:
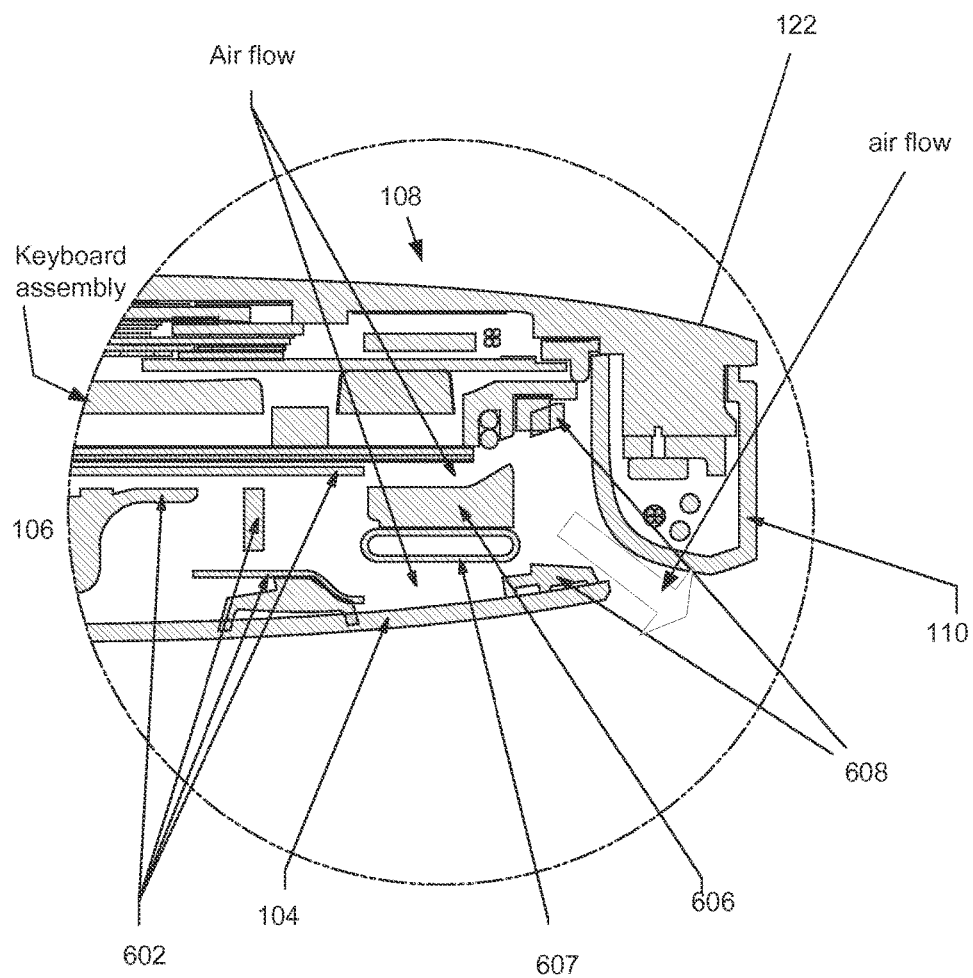
FIG. 12B shows a cross section of a rear portion of the portable computing system shown in FIG. 12A in accordance with the described embodiments.

FIG. 12A shows portable computing system 100 with bottom case 104 and the battery removed to reveal various internal components and structures. For example, fan assembly 602 can be used to exhaust waste heat provided by heat transfer module 604. Heat transfer or thermal module 604 can include stages 603 and 605. Stages 603 and 605 can thermally and mechanically couple beat pipe 606 with heat generating components such as central processing unit (CPU) and a graphics controller (GPU), respectively. In the embodiment shown, waste heat can be transferred to coolant material (such as water) in heat pipe 606 and transported to fin stack 608. Fan assembly 602 can then force comparatively cooler air through fin slack 608 causing heat to transfer from the coolant material in heat pipes 606 to the cooler air that can then be exhausted by way of rear vent 607. FIG. 12B shows a cross sectional view of fan assembly 602 and associated components.

FIGS. 13*a*-13*d* show an implementation of thermal module 604 in further detailed views in accordance with the described embodiments. Thermal module 604 can include stage 602 and stage 605 (that can also take the form of spring stages) that can contact a top portion of integrated circuits CPU and GPU, respectively. Stages 603 and 605 can have a substantially uniform thickness and can act as a stage as well as beam and spring. Stages 603 and 605 can provide an efficient thermal heat transfer path between the CPU and the GPU and heat pipe 606. Thermal module 604 can have a low Z stack and therefore is well suited for compact computer systems. In order to provide the efficient thermal path, stages 603 and 604 can be formed of a material having superior thermal and mechanical properties. The superior thermal properties can facilitate the transfer of heat from the CPU and the GPU to heat pipe 606. The superior mechanical properties can assure a good mechanical coupling between stages 603 and 605 and the CPU and the GPU, respectively. In particular, the application of sufficient pressure to form a good mechanical/thermal interface can substantially improve the overall heat transfer characteristics of thermal module 604.

Referring back to FIG. 12, audio circuits 616 and 618 can be attached to an interior surface of top case 106 that can in one embodiment, port audio from portable computing device 100 through keyboard 114. Touch pad/keyboard circuit 620 can be connected by way of flex 622 to MLB 612. Antenna cable 624 can be secured to top case 106 using cable ties 626 whereas openings 628 and 630 (referred to as hammerhead openings shown in FIG. 15) can aid in routing cables 632 and 634, respectively. Board to board connector 638 can include stabilizers to prevent pin to pin shorting when pins on board to board connector 638 are inserted into corresponding openings.

Figure 14A:
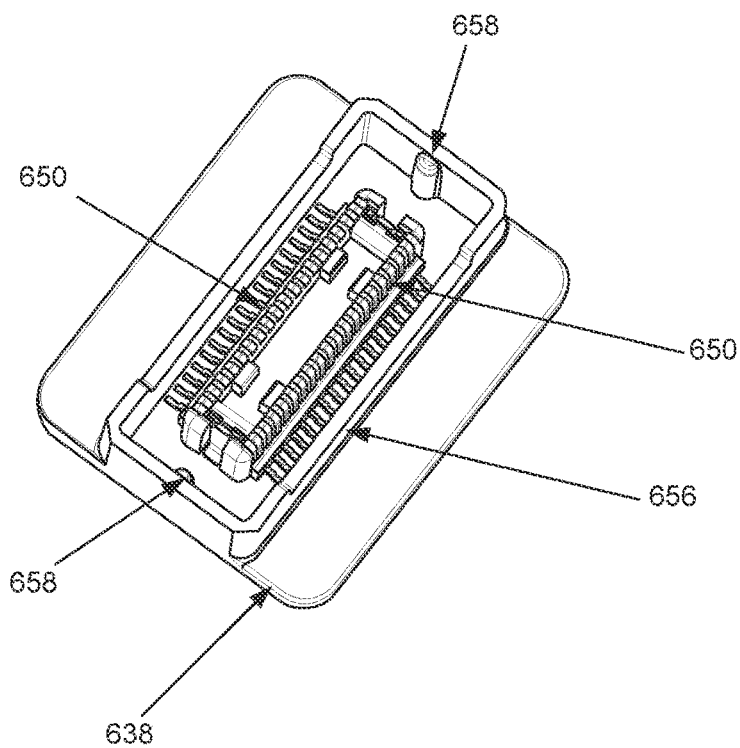
FIGS. 14a and 14b show board to board connectors with anti-angulation devices in accordance with the described embodiments.
Figure 14B:
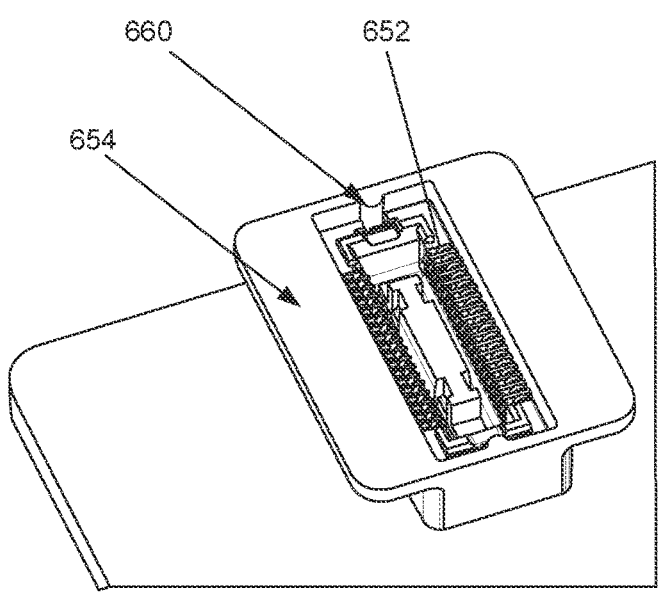

For example, as shown in FIGS. 14*a* and 14*b*, board to board connector 638 can have a number of pins 650 can be inserted into corresponding openings 652 on connector 654 as a mated pair. In order to prevent angular displacement when pins 650 are inserted into openings 652, plastic frame 656 can be provided. Plastic frame 656 can prevent angular misalignments. Specifically, proud feature 658 on either end of plastic frame 656 can be placed into corresponding slots 660 on connector 654 creating in essence half a piston on connector 638 forcing pins 650 to be properly aligned with openings 652 prior to insertion. In this way, by combining plastic frame 656 with a pre-existing component, a potentially damaging event can be prevented.

Figure 15:
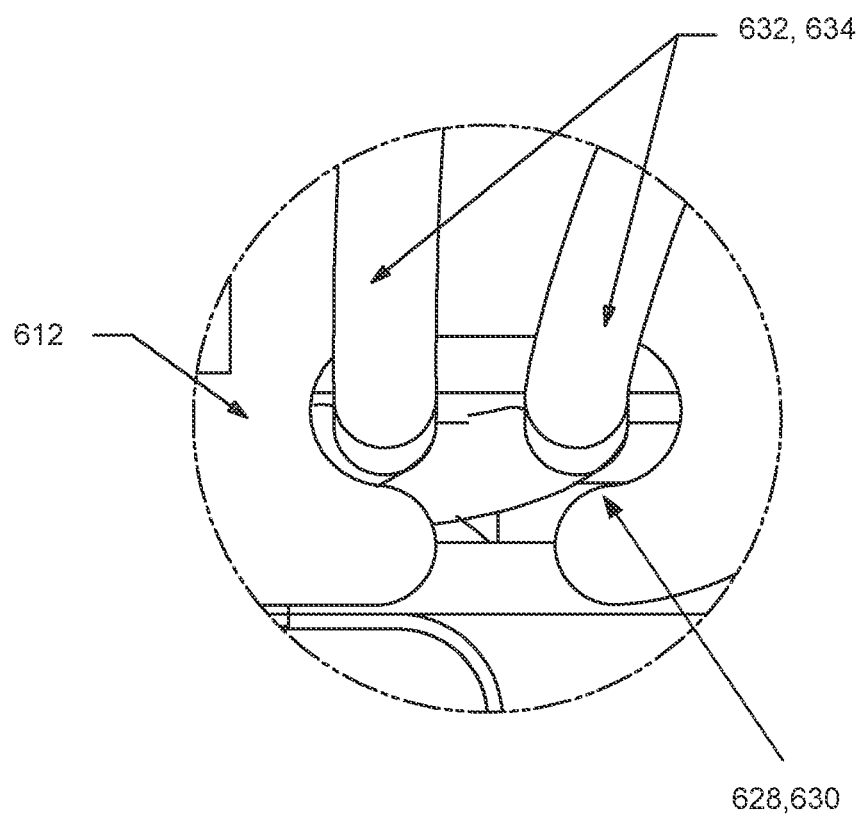
FIG. 15 illustrates openings used to aid in promoting good cable dress in accordance with the described embodiments.

FIG. 15 shows a specific implementation of openings 628 and 630 used to route cables 632 and 634. Openings 628 and 630 can provide a deterministic way of assembling cables and ensuring proper spatial placement and retention without adding parts. In the described embodiment, openings 628 and 630 can be shaped to resemble a hammer head to accommodate cables 632 and 634. It should be noted, however, than any appropriate shape can be suitable. In this way, without resorting to adding components, cable, dress (i.e., the efficient layout and aesthetic appearance) of cables can be enhanced. For example, openings 628 and 630 in MLB 612 can assist in cable routing by providing a well defined path for cable placement that can assist in reducing unnecessary cable routing reducing both time and expense in assembly.

Figure 16:
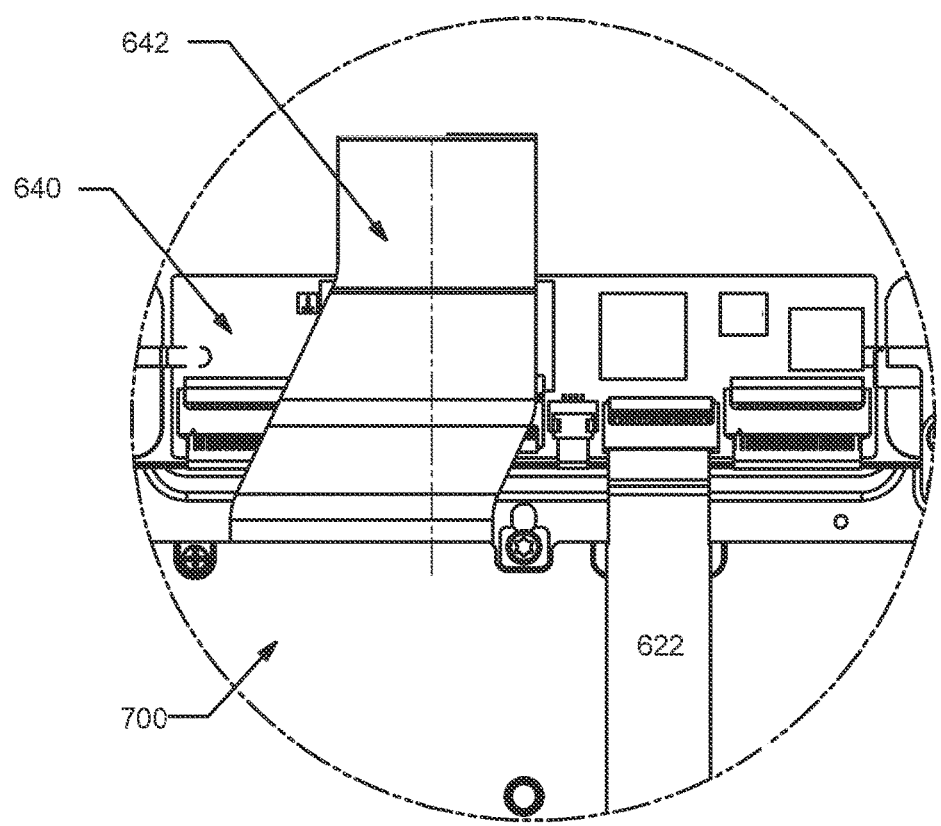
FIG. 16 shows an expanded view of region of a keyboard/track pad circuit that can include various keyboards and touch pad processing components in accordance with the described embodiments.

FIG. 16 shows an expanded view of region 700 of IPD circuit 640 (also shown in FIG. 12) that can include various key boards and touch pad processing components. Region 700 also shows keyboard tail 642. The processing components can be configured to receive signals generated from an actuation of a sensor, such as a membrane associated with the keyboard and an actuation of one or more sensors associated with touch pad 116 such as a dome switch that can be configured to detect a position and/or change in position of one or more objects on the top surface of the touch pad, such as the tips of one or more user's fingers. In one embodiment, the sensor can be constructed from a PET material. The processing components can also include a keyboard interface that can be configured to receive keyboard connector that can be configured to communicate signals generated from user inputs received at the keyboard, such as signals generated via actuation of a membrane sensor associated with the keyboard. After processing, the signals from the touch pad and/or the keyboard can be sent to the main logic board MLB 612 by way of flex 622.

Figure 17A:
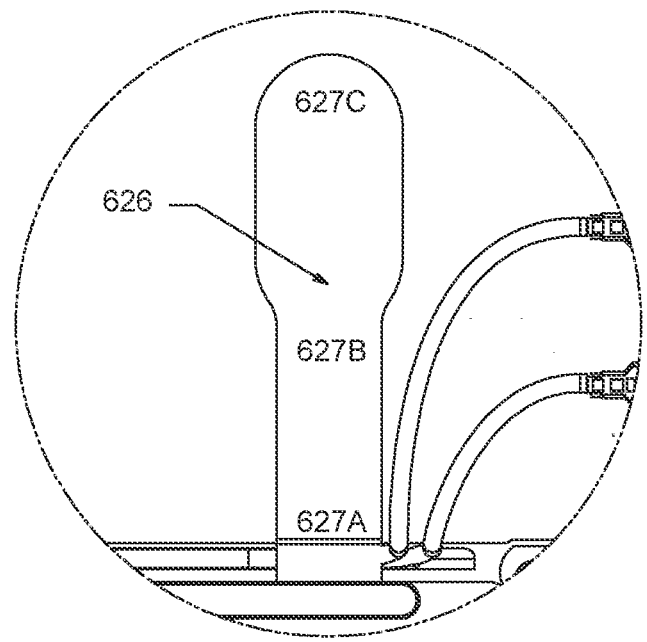
FIGS. 17a and 17b show cable straps used to secure cables in accordance with the described embodiments.
Figure 17B:
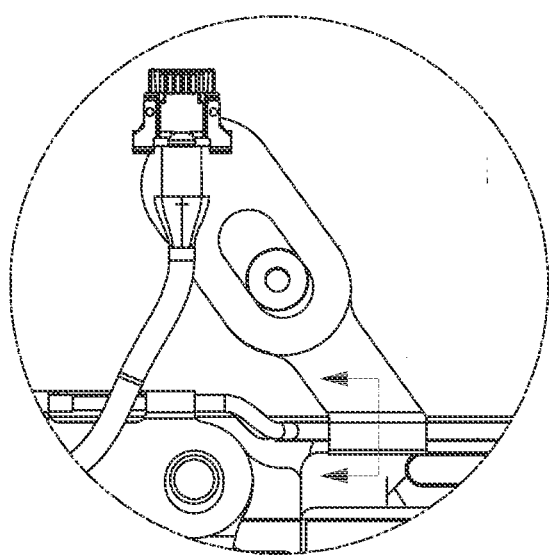
Figure 18:
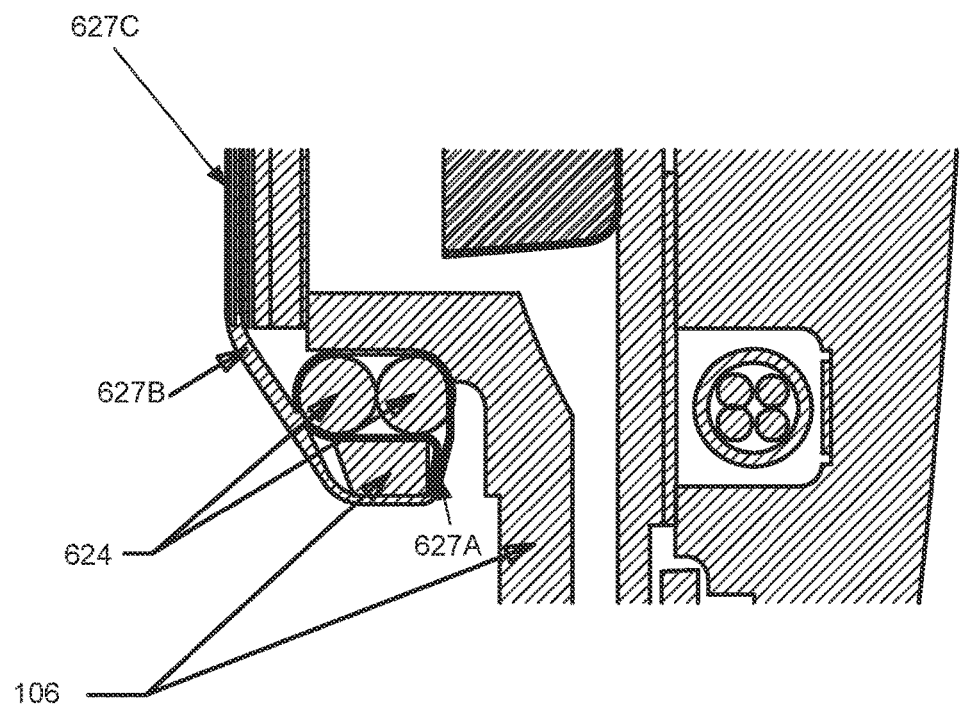

FIGS. 17*a* and 17*b* show representative cable straps 626 used to secure cables such as antenna cable 624 as shown in FIG. 18. In particular, since certain cables can be difficult to route due to their size and resistance to bending, providing good cable dress for these types of cables can be difficult and time consuming especially in the small working areas available in portable computing system 100. Therefore, cable straps 626 can provide an easy and efficient mechanism for quickly routing and securing cables such as antenna cable 624. The cable straps can take many forms as appropriate for the particular cable and location. For example, FIG. 17*a* shows a particular implementation of a cable strap in the form of cable strap 626 having base portion 627A, body portion 627B and "tongue" portion 627C that can be used to route and secure antenna cable 624. As shown in FIG. 18, in order to secure antenna cable 624, base portion 627A of cable strap 626 is first attached to top case 106 and antenna cable 624. With base portion 627A securely attached to top case 106 and securing antenna cable 624, body portion 627B of cable strap 626 wrapped around antenna cable 624 such that tongue portion 627C is secured to top case 106 using, for example, adhesive. In this way, antenna cable 624 can be easily routed and secured in a simple and efficient operation that lends itself to an overall neat and clean appearance resulting in good cable dress. FIG. 17*b* shows another embodiment of cable strap 626.

Figure 19:
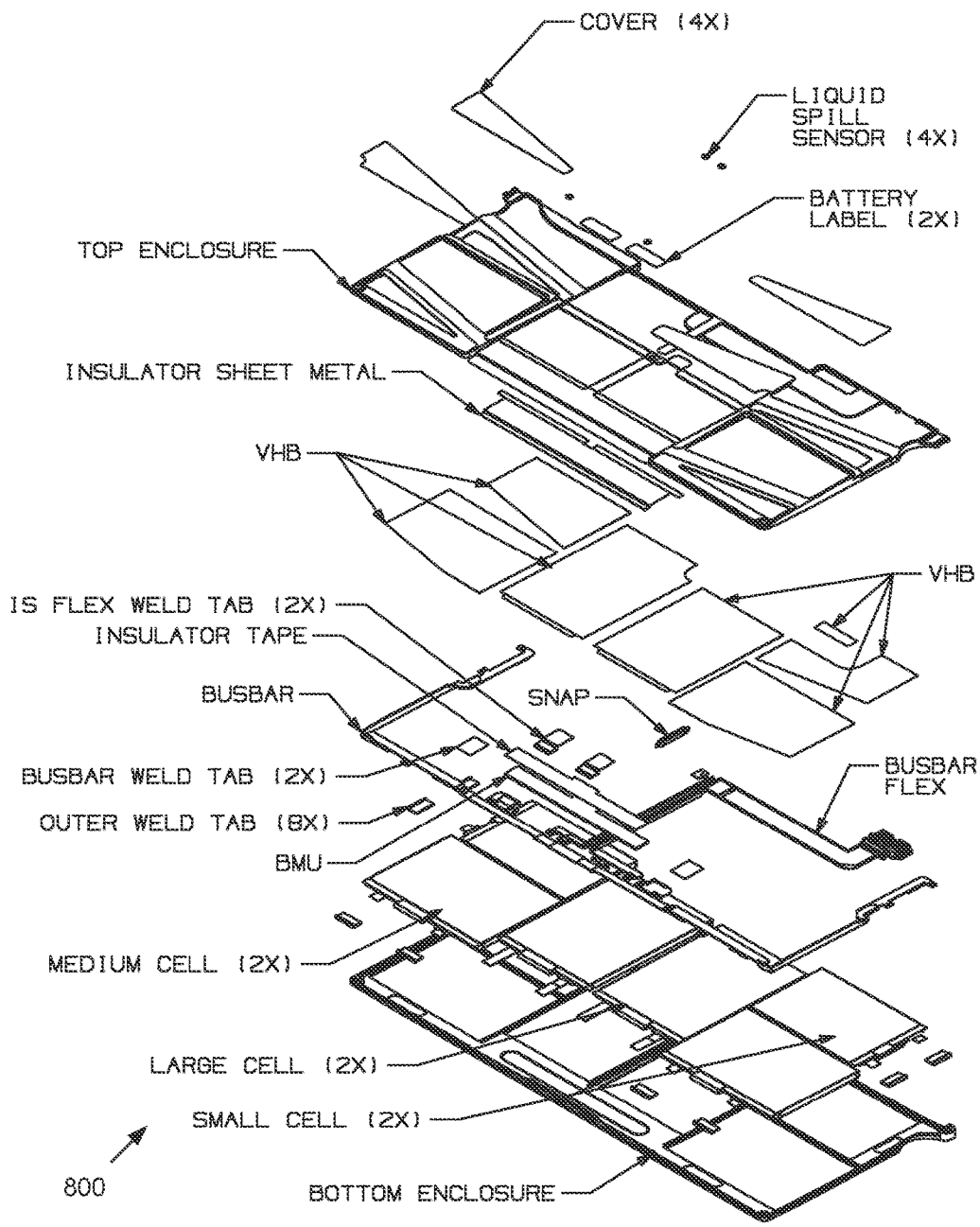
FIG. 19 shows an exploded view of a battery assembly in accordance with the described embodiments.
Figure 20:
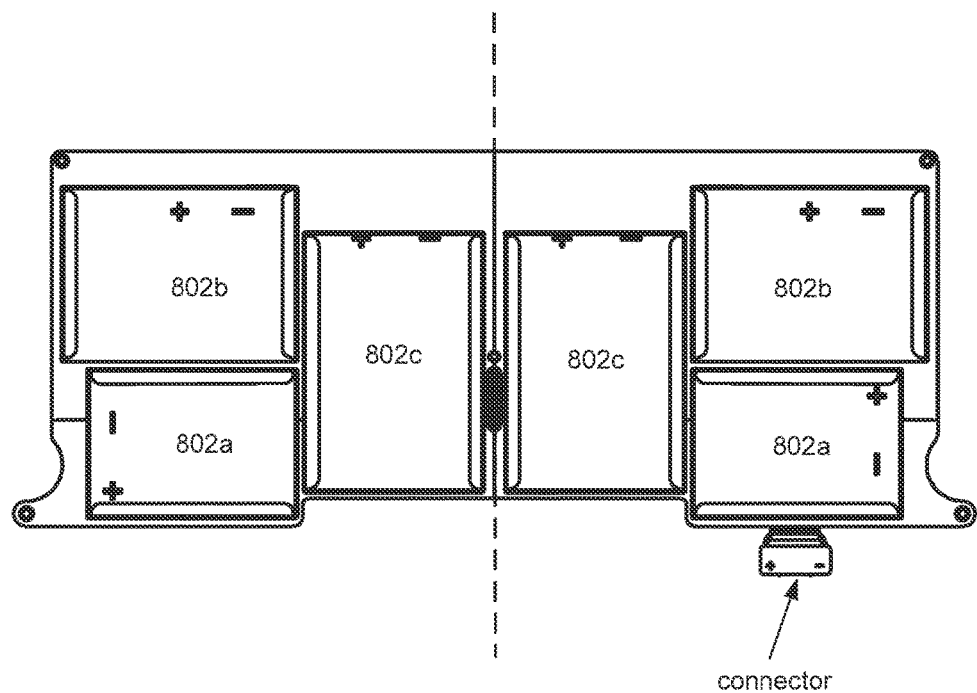
FIG. 20 shows specific mirror image configuration of a framed battery arrangement in accordance with the described embodiments.

FIG. 19 shows an exploded view of battery assembly 800 in accordance with the described embodiment. Battery assembly 800 can include a number of asymmetrically arranged individual battery cells 802 enclosed in a frame shown in more detail in FIG. 20 and described in more detail in U.S. patent application INTEGRATED FRAME BATTERY CELL having Ser. No. 12/714,737 that is incorporated by reference in its entirety. Battery cells 802 can be configured in a mirror image arrangement. For example, battery cells 802*a*, 802*b*, and 802*c* on side 804 can have corresponding battery cells 802*a*, 802*b*, and 802*c* placed in a mirror arrangement on side 806 of battery assembly 800. In the described embodiment, battery cells 802*a* can have different properties than 802*b* or 802*c*, and vice versa. Battery 800 can have a distributed battery management unit (BMU). In any case, by varying the size and properties of battery cells 802, battery 800 can be arranged to have a low Z stack that can conform to an overall size and shape of portable computing device 100.

High Speed Memory Card and Connector

Referring back again to FIG. 12, memory device 610 can be used to store data as system main memory. Memory device 610 can be a high speed memory card, and can take the form of a solid state memory device such as FLASH memory that can be connected to other internal circuits such as for example, main logic board, or MLB 612 by way of a high speed connector 614. In the described embodiment, memory device 610 can take the form of a single layer of FLASH memory chips which in the described embodiment can number four. However, it should be noted that any suitable number of memory chips can be used. In addition to memory chips, one or more controller chips can be included. Memory device 610 can be mounted to connector 614 by sliding contacts or pins 615 shown in FIGS. 21*a*-21*d* into place into connector 614 and then securing memory device 610 using a fastener through opening 617. In this way, the reduced Z stack of memory device 610 can be improve overall system integration by being able to use space would otherwise not be useable with a conventionally configured solid state memory device. For example, the lateral stack arrangement of memory device 610 can be fitted in the space above system memory (not shown). It should be noted that in some embodiments, memory device 610 can have a dual sided configuration in which the memory chips can be mounted to both sides of memory device 610. This arrangement can be well suited by computing systems having somewhat more available space than the particular embodiment shown in FIG. 12.

In particular, FIGS. 21*a* through 21*d* show SSD memory module 610 in perspective, side, bottom and top views respectively in accordance with the described embodiments. As noted above, SSD memory module 610 can include memory chips 611 on one side whereas in other embodiments, the memory chips can be located on both sides of SSD memory module 610. Again, one or more controller chips 613 can also be used, and the card 610 can also include one or more insulator regions 619. In the embodiments shown, SSD memory module 610 can be arranged in a "stick of gum" arrangement wherein active components of SSD memory module 610 are arranged in a lateral fashion. In this way, SSD memory module 610 can have a low Z stack and can therefore be placed-within portable computing device 100 in areas that would unavailable to conventionally configured solid state memories. In particular, minimizing the number of components and placing the components in a space efficient manner, SSD memory module 610 can be accommodated in a region directly above CPU memory creating a region of high component packing density.

Although a wide variety of shapes, sizes and dimensions can be used for such a high speed SSD memory module 610, various specific dimensions can provide context with respect to the particular examples set forth in FIGS. 12 and 21*a* through 21*d*. For example, memory module or card 610 can have an overall length (including the contacts/pins) of about 108-110 mm, a width of about 23-25 mm, and a board thickness of about 0.6-0.8 mm. More specifically, memory module or card 610 can have an overall length of about 108.9 mm, a width of about 24 mm, and a board thickness of about 0.7 mm. The maximum thickness for memory chips or other components located on the board can be about 1.4 mm at most locations on the card, although reduced maximum thicknesses may apply near the board edges. The maximum combined thickness of the module at all locations than is about 2.2 mm. Opening 617 can be in the shape of a semicircle having a diameter of about 6 mm.

Figure 22A:
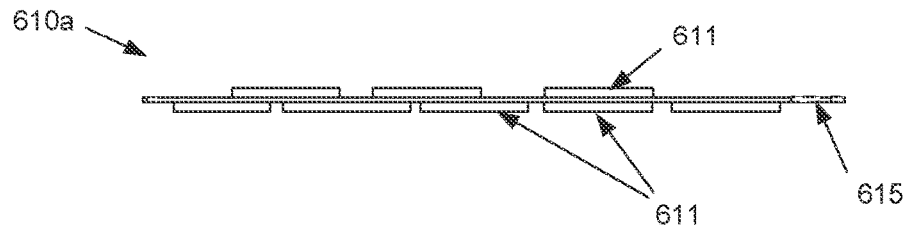
FIG. 22a shows in side view an alternative SSD memory module having memory chips on both sides thereof in accordance with the described embodiments.

Moving next to FIG. 22*a*, an alternative SSD memory module having memory chips on both sides thereof is shown in side view. SSD memory module or card 610*a* can be substantially similar to card 610 above, except that memory chips 611 can be included on both sides of the card. Such memory chips on both sides of the module can all feed to the set of contacts or pins 615 located on one edge of the SSD memory module.

Figure 22B:
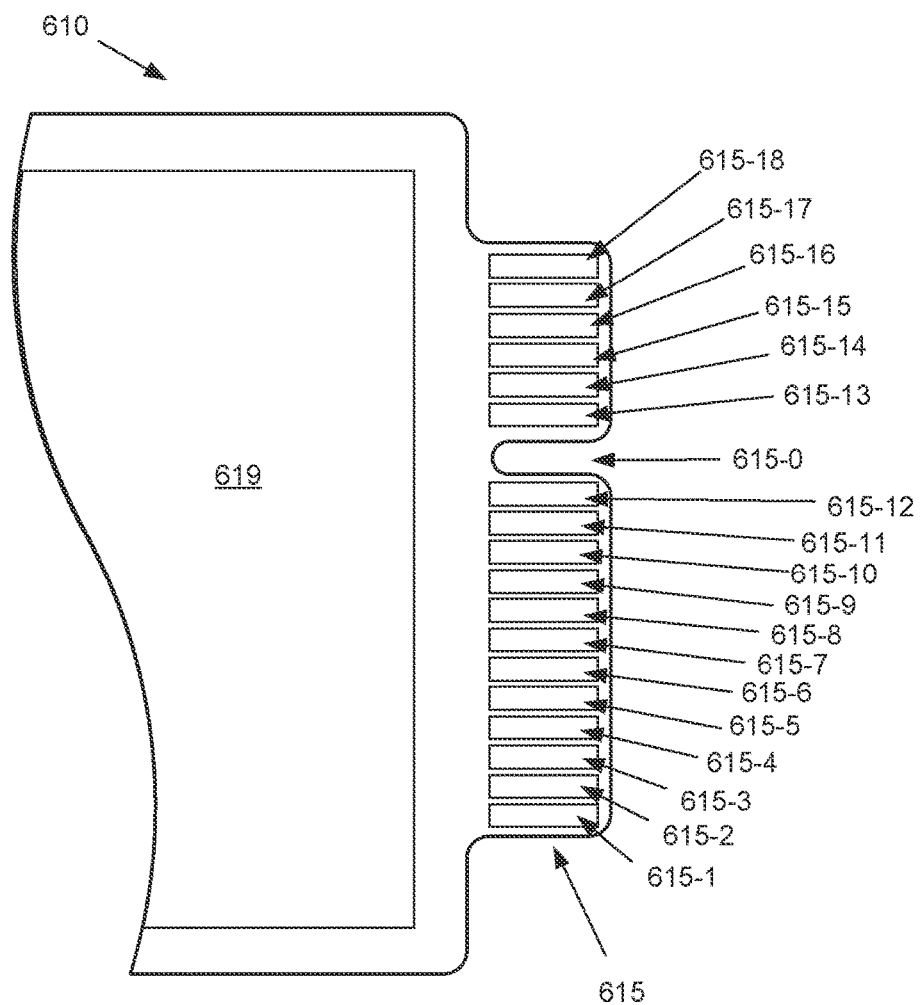
FIG. 22b shows in close up view the contacts of an SSD memory module in accordance with the described embodiments.

FIG. 22*b* shows in close up view the contacts of an SSD memory module in accordance with the described embodiments. Again, SSD memory module or card 610 can include one or more insulator regions 619, as well as a set of contacts 615 located at one edge of side of the card. In some embodiments, exactly eighteen contacts 615 can be used, although it will be readily appreciated that more or less contacts might be used for a given application. In the specific embodiment shown, the eighteen contacts are separated into a first portion of six contacts and a second portion of twelve contacts. These first and second/portions or groups of contacts can be separated by a physical gap 615-0, which can be used to help facilitate the proper insertion of the module into a respective connector. For example, gap 615-0 can be arranged to fit around a post or other physical stop inside the connector arrangement, such that an attempt to insert the memory module 610 backward will not succeed.

In the specific embodiment shown, each of the contacts or pins 615 can have a specific purpose or function. For example, starting from the first contact at the bottom of the second portion of twelve contacts, each of the contacts can have the following specific functionality:

| PIN NUMBER | SIGNAL |
| --- | --- |
| 615-1 | RESERVED |
| 615-2 | GND |
| 615-3 | SATA_HDD_D2R_P |
| 615-4 | SATA_HDD_D2R_N |
| 615-5 | GND |
| 615-6 | GND |
| 615-7 | SATA_HDD_R2D_N |
| 615-8 | SATA_HDD_R2D_P |
| 615-9 | GND |
| 615-10 | TUTX |
| 615-11 | TURX |

-continued

| PIN NUMBER | SIGNAL |
|---|---|
| 615-12 | GND |
| 615-13 | DAS/DSS |
| 615-14 | PRESENCE |
| 615-15 | Vcc |
| 615-16 | Vcc |
| 615-17 | Vcc |
| 615-18 | Vcc |

Although other contact arrangements and functionalities are certainly possible, the foregoing specific configuration is thought to work well for the particular portable computing device disclosed herein.

Figure 23:
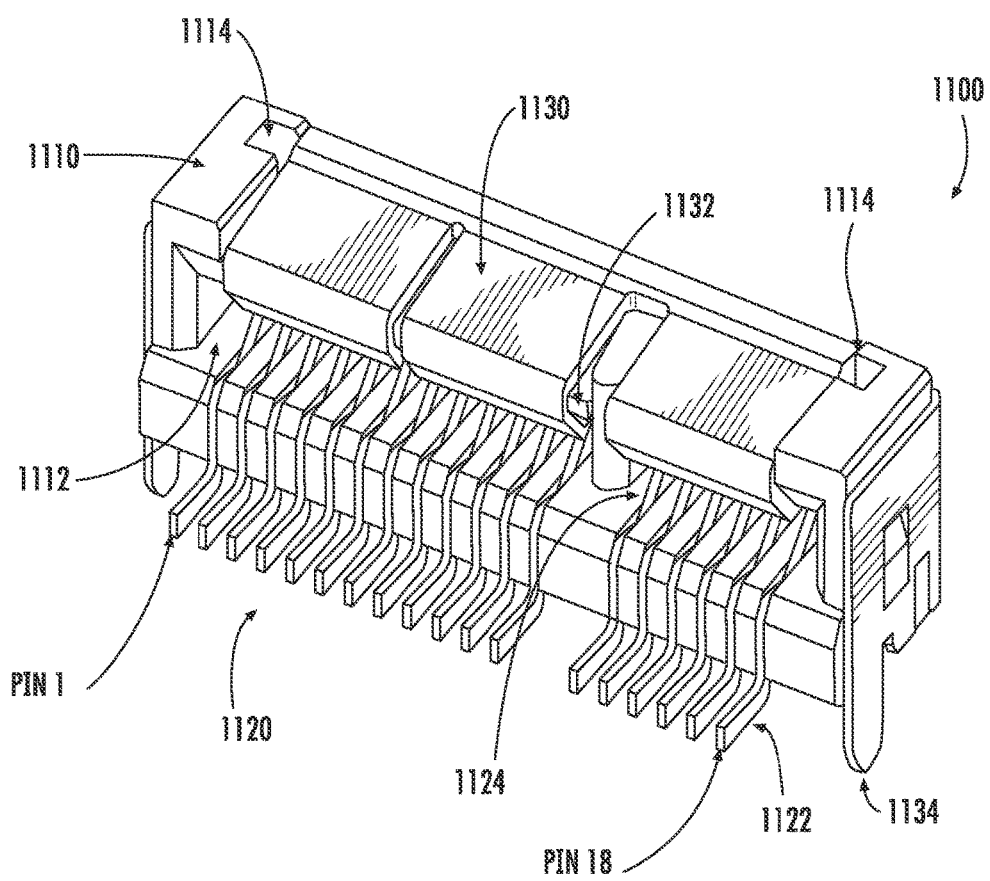
FIG. 23 shows in top perspective view a connector in accordance with the described embodiments.

Turning now to FIG. 23, various details regarding a high speed connector for use with the foregoing SSD memory module are provided in the illustration as show in top perspective view. This figure, as with the other included figures, is shown for illustrative purposes and does not limit either the possible embodiments of the present invention or the claims.

Connector 1100, which can be identical of substantially similar to connector 614 noted above generally, may include tentative housing 1110, a plurality of contacts 1120, and shield 1130. This connector may be mounted on a printed circuit board. The printed circuit board may be a motherboard, main board, multilayer board, or other type of board. Connector 1100 may be adapted to receive a card or board, such as a daughter or optional card or board.

Insulative housing 1110 may include moot side opening 1112 for receiving a daughter or optional card. Insulative housing 1110 may also include one or more openings 1114, shown in this example on a top side of insulative housing 1110. These one or more openings 1114 may be used to visually or otherwise determine that a card is properly inserted into connector 1100.

In this example, each of the plurality of contacts 1120 may include a first portion 1122 and a second portion 1124. First portion 1122 may extend away from a front of housing 1110. First portion 1122 may be used to make contact with a contact or pad located on a printed circuit board. Second portion 1124 may be approximately in line with first portion 1122. Second portion 1124 may make contact with a contact on a card when the card is inserted into connector 1100. Each of the contacts 1120 may also include a third portion (not shown) for mechanical stability, as will be discussed below.

Shield 1130 may cover al least a top portion and a back portion of connector 1100. Shield 1130 may be used as a ground plane, where it connects to one or more ground contacts on a card and one or more ground contacts on the printed circuit board. Shield 1130 may be split into two or more portions. In this specific example, shield 1130 may be split into three portions. Splitting shield 1130 into portions may improve the grounding provided by shield 1130 by ensuring that shield 1130 comes into contact with ground contacts on a card at three or more points when the card is inserted into connector 1100. In this specific example, one or more portions 1132 of shield 1130 may be folded back under a top portion of shield 1130. With this arrangement, when a card is inserted Into opening 1112 of connector 1100, shield portion 1132 may press down on atop surface of the card, thereby engaging one or more ground contacts. This action may also push contacts on the card into second portions 1124 of contacts 1120 to form electrical pathways. Tabs 1134 may be located on shield 1130 and may be used to connect shield 1130 to grounds on a printed circuit board.

Embodiments of the present invention may provide connectors having high-speed paths between a daughter or optional card and a printed circuit board. Specifically, first portions 1122 and second portions 1124 of contacts 1120 may form shop and direct paths over which one or more signals and power supplies may travel. Also, these paths may be shielded by shield 1130, which may improve signal quality and allows for faster data rates. By splitting shield 1130 into multiple portions, ground connections between ground on a card and a shield may be improved.

Moreover, the short and direct paths provided by contacts 1120 may allow connector 1100 to have a low profile. A third portion of contacts 1120 may be used to provide mechanical stability. This third portion may be approximately in line with first portions 1122, and parallel to a bottom of the connector 1100.

Embodiments of the present invention may provide connectors that improve the reliability of the manufacturing process. Specifically, first portions 1122 may be surface mounted contacts. These first portions 1122 may be soldered to pads or contacts on the printed circuit board. This may allow for easy inspection of solder connections of contacts 1122 the printed circuit board. Also, openings 1114 may allow for inspection to ensure that a card is properly inserted into connector 1100.

Figure 24:
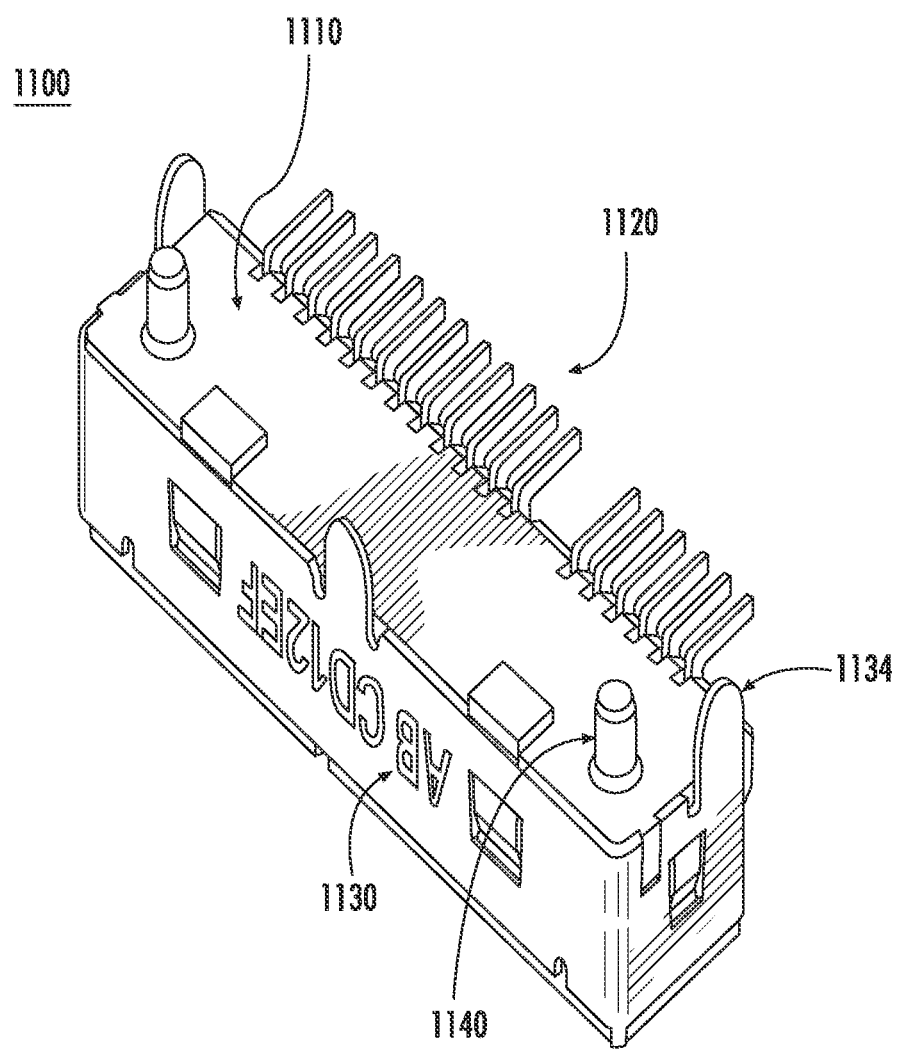
FIG. 24 shows in bottom perspective view a connector in accordance with the described embodiments.

FIG. 24 illustrates a bottom, perspective view of a connector 1100 in accordance with the described embodiments. This figure includes insulative housing 1110, a plurality of contacts 1120, and shield 1130. Insulative housing 1110 may include tabs 1140. These tabs may be used to provide mechanical support for connector 1100 on a printed circuit board. Tab 1134 may be used to form an electrical connection between shield 1130 and ground lines or planes on a printed circuit board. In various embodiments, housing 1110 may be plastic or other insulative material. Contacts 1120 may be stainless steel, copper, brass, aluminum, or other conductive material. Similarly, shield 1130 may be stainless steel, copper, brass, aluminum, or other conductive material.

While eighteen contacts are shown in this specific example, again other numbers of contacts may be used. Also, while first portions 1122 are shown as extending from the front of contacts 1100, in other embodiments of the present invention they may extend in other directions. For example, they may extend in a downward direction, or they may extend towards the back of connector 1100. In other embodiments of the present invention, first portions 1122 end second portions 1124 of contacts 1120 may be the same portion. Moreover, while shield 1130 is shown as having a particular configuration, other configurations may be possible. For example, shield 1130 may not be split into multiple portions, while in other embodiments of the present invention; shield 1130 may be split into two or more portions. Also, while one or more openings 1114 are shown in top of insulative housing 1110, in other embodiments, these openings may be omitted, there may be more or fewer than two openings 1140 and the openings may be provided elsewhere. Again, connector 1100 may accept or receive a daughter or optional card, with one example being shown in the following figure.

Figure 25:
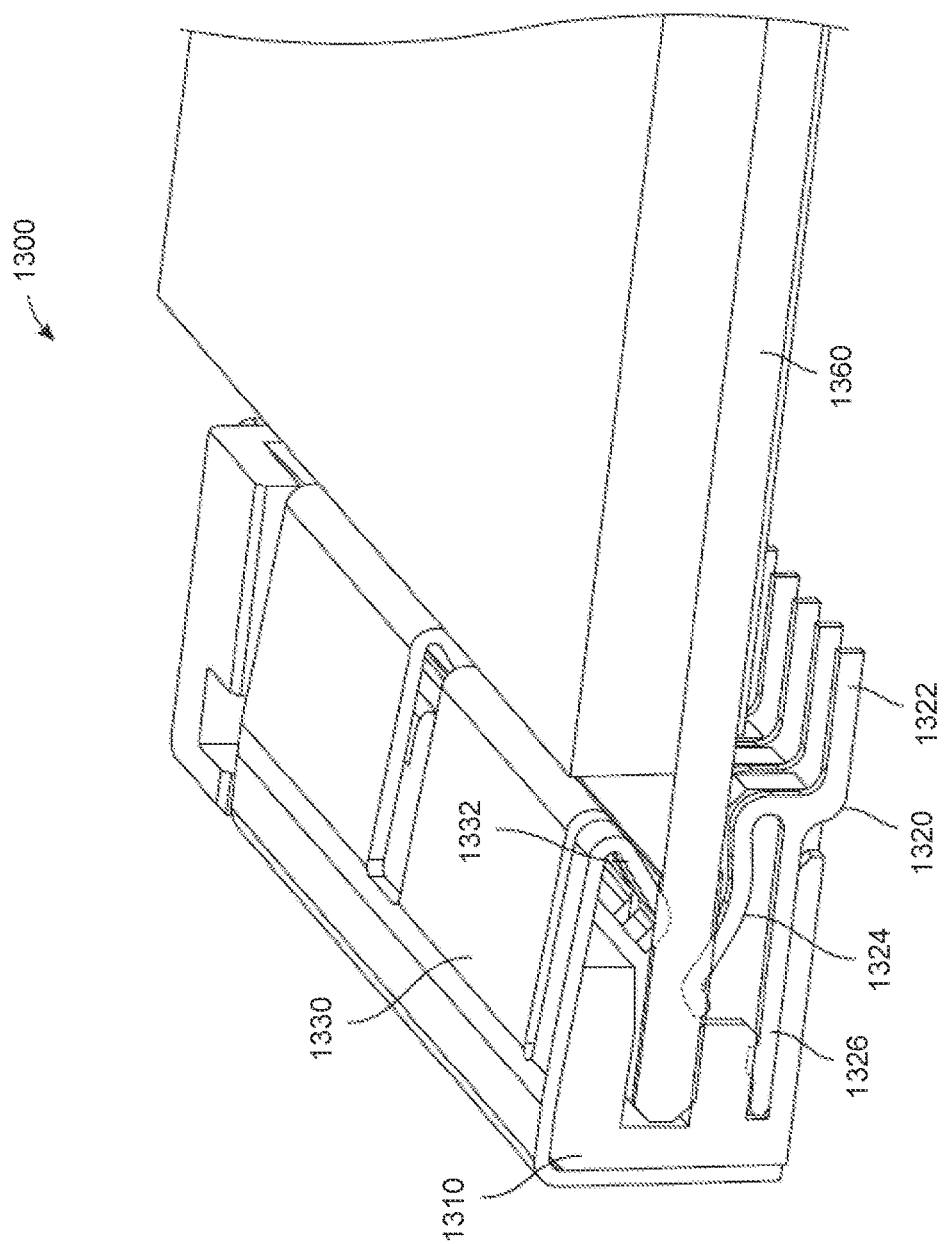
FIG. 25 shows a daughter or optional card inserted into a connector in accordance with the described embodiments.

FIG. 25 illustrates a daughter or optional card inserted into a connector in accordance with the described embodiments. This example includes a connector 1300 receiving a daughter or optional card 1300. Card 1300 can be Identical or substantially similar to SSD memory module 610 or 610a set forth in greater detail above. When card 1300 is inserted into connector 1300, contacts on a top of card 1360 may form electrical connections with portion 1332 of shield 1330. Contacts on a bottom portion of card 1360 may form electrical connections with second portions 1324 of contacts 1320. Again, various embodiments may provide a very short signal path from card 1310 to a printed circuit board on which connector 1300 resides. Specifically, the signal path may include first portion 1322 and second portion 1324 of contacts 1320. Contacts 1320 may also provide mechanical stability by including third portion 1326. Specifically, third portion 1326 may extend into insulative housing 1310. In this example, second portion 1324 and third portion 1326 may extend into insulative housing 1310, while first portion 1322 may extend away from the front of connector 1300. Second portion 1324 and third portion 1326 of contact 1320 may be approximately in line with first portion 1322. Third portion 1326 may extend approximately parallel to a bottom of connector 1300.

Figure 28:
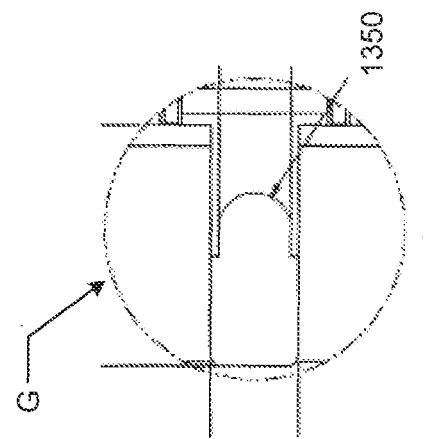
FIG. 28 shows a detail of a portion of a top of a connector in accordance with the described embodiments.
Figure 27:
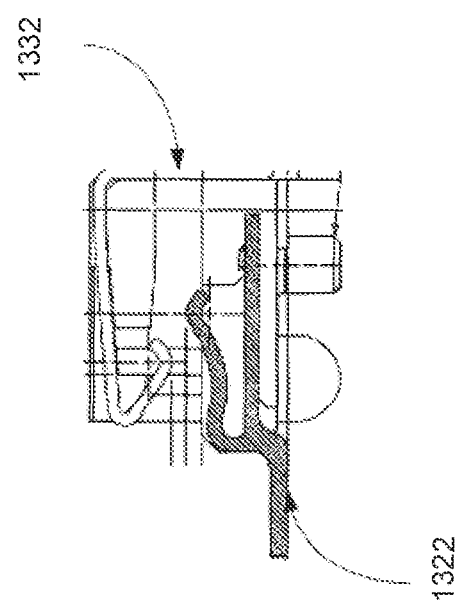
FIG. 27 shows in cross-sectional view a connector receptacle in accordance with the described embodiments.
Figure 26:
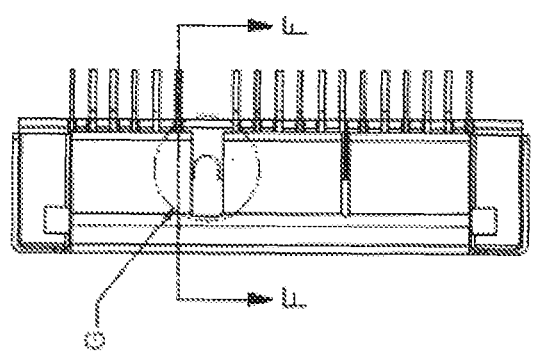
FIG. 26 shows in top view a connector in accordance with the described embodiments.

FIG. 26 illustrates a top view of a connector, while FIG. 27 illustrates a cross-sectional view along the line F-F of the connector receptacle of FIG. 26. Shown is a cross-sectional view of contact 1322 and shield 1332 according to an embodiment of the present invention. FIG. 28 shows a detail region G from FIG. 26 of a portion of a top of a connector in accordance with the described embodiments. As shown, physical stop 1350 can be used to separate the contacts into multiple groups. As noted above, physical stop 1350 can also be arranged to mate with the gap 615-0 in an associated memory card, such that the memory card cannot be Inserted backwards into the connector.

Figure 29:
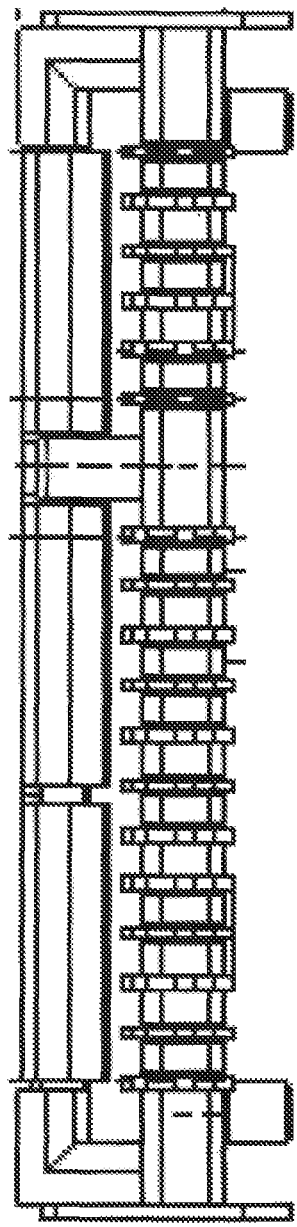
FIG. 29 shows in front view a connector in accordance with the described embodiments.
Figure 32:
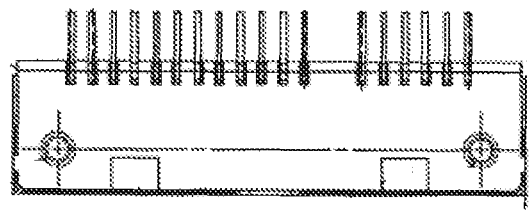
FIG. 32 shows a bottom view of a connector in accordance with the described embodiments.
Figure 31:
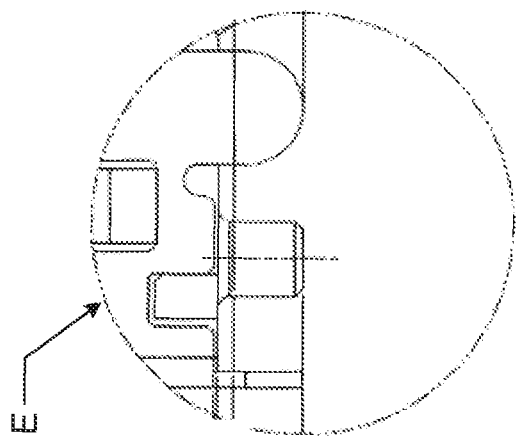
FIG. 31 shows a detail of a side view in accordance with the described embodiments.
Figure 30:
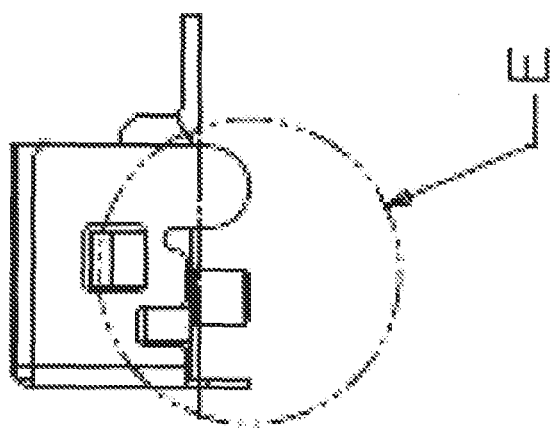
FIG. 30 shows in side view a connector in accordance with the described embodiments.

FIG. 29 shows in front view a connector in accordance with the described embodiments. FIG. 30 shows in side view a connector in accordance with the described embodiments. FIG. 31 shows a detail region E from FIG. 30 of a side view in accordance with the described embodiments. FIG. 32 shows a bottom view of a connector in accordance with the described embodiments.

Again, in these examples, illustrative examples of embodiment of the present invention have been shown. It should be noted that variations on portions of these connectors, such as insulative housings 1110, contacts 1120, and shields 1130, and portions thereof, may be made consistent with embodiments of the present invention, and none of these are required to have the particular shape, size, arrangement, or other characteristics shown in the figures in order for a connector according to an embodiment of the present invention to function properly.

Figure 33:
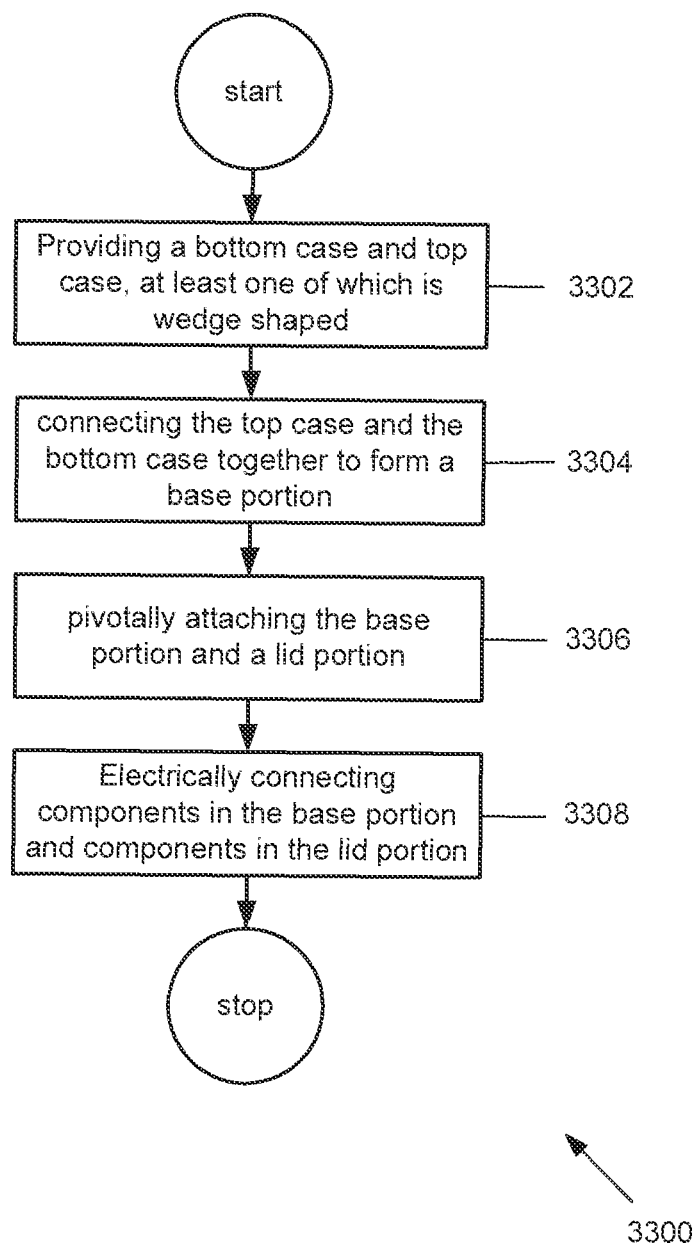
FIG. 33 shows a flowchart detailing a process in accordance with the described embodiments.

FIG. 33 shows a flowchart detailing a process in accordance with the described embodiments. Process 3300 can start at 3302 by providing a bottom case and top case, at least one of which has a wedge shape. At 3304, the bottom case is coupled to the top case to form a complete housing for a base portion of the portable computing device for enclosing at least a plurality of operational components and a plurality of structural components. The base portion defines a wedge shape such that the one or mote user input components are presented at an angle to a user of the portable computing device, and this wedge shape is a result of the top case or bottom case being wedge shaped. At 3306, the base portion is pivotally connected to a lid portion by a hinge assembly. In the described embodiments, the lid portion has at a plurality of components at least one of which is a display. At 3308, at least some of the components in the lid portion are electrically connected to operational components in the based portion by way of one or more electrical conductors that run through the hinge assembly.

Touch Pad

With respect to the following figures a number of features of the touch pad assembly are described. The touch pad assembly interfaces with a front of the body portion of the housing. The body portion of the housing can be wedge shaped, where the tip of the wedge is in a front edge of the body portion. As the tip of the wedge is approached, the volume that is available for packaging the components that are installed in this region of the body portion of the housing can be decreased. To accommodate the decreased volume available for packaging device components near the tip of the wedge and to improve overall the packing efficiency of the body portion of the housing, the touch pad can be designed with a number of features that decrease the volume that it and nearby components occupy.

As examples, to provide a thinner profile, the touch pad can be constructed from a material (stick as glass) that serves as 1) cosmetic surface for the touch pad and 2) a load bearing structure. Further, the signal processing for the touch pad and the keyboard can be combined on the touch pad. The combined signal processing can eliminate a separate processing component and a connector to the MLB associated with the keyboard signal processing. The elimination of these components can improve the packing efficiency of the body portion of the housing.

Besides packing-efficiency, the touch pad can be designed to produce a desired aesthetic performance. The aesthetic performance can include a "feel" provided to the user as the touch pad is utilized. The touch pad can be configured to 1) detect a change in position of an object, such as a user's finger over the top surface, and 2) detect a deflection of the touch pad resulting from a downward force exerted by the object. The touch pad can include a dome switch mounted on its bottom surface that is activated in response to a downward force provided by a user on a top surface of the touch pad. The dome switch can be sealed to prevent moisture ingress that can damage the dome switch. A scaling mechanism is described that can prevent moisture ingress and provide a desired aesthetic feel when the touch pad is operated.

In particular, the sealing mechanism can be configured with pathways that allow a volume associated with the dome switch to remain somewhat constant when the sensor is compressed during actuation of the touch pad. If the sealing mechanism was designed without these pathways, then the volume associated with the dome switch would be decreased during actuation. The resulting compression of the volume can result in force feedback response during actuation that is aesthetically undesirable.

Figure 34:
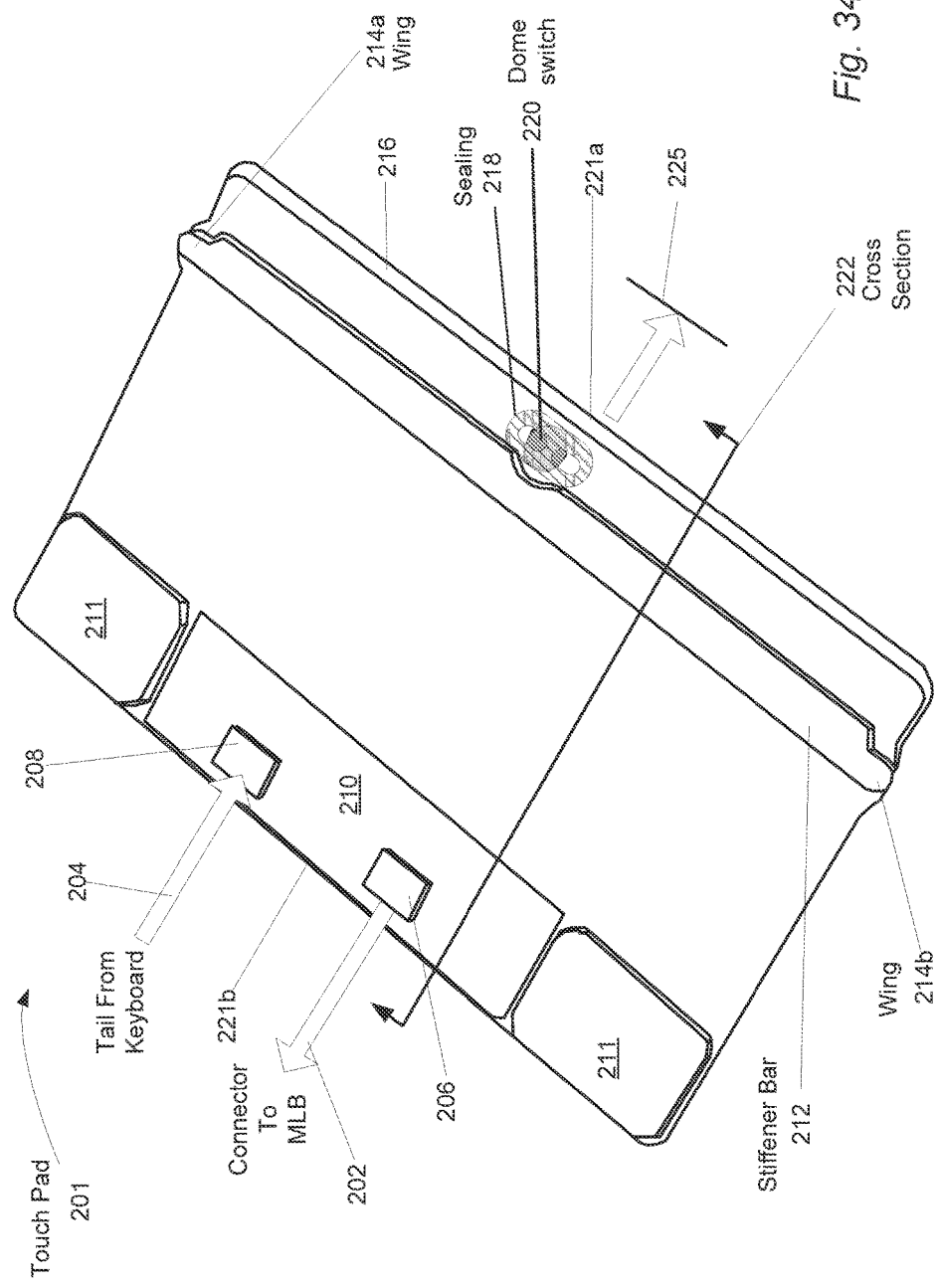
FIG. 34 is a perspective drawing of a touch pad in accordance with the described embodiments.

To illustrate the features described above, a perspective drawing of a touch pad viewed from a bottom surface is described with respect to FIG. 34. With respect to FIG. 35, a proximate positioning of the touch pad within the body portion of the housing is discussed. In FIG. 36, a cross section of the touch pad at one location is shown and components associated with the cross section including a design configuration that can help provide an overall thinner cross section are discussed. With respect to FIGS. 37a and 37b, a sealing mechanism for the dome switch and the affect of the sealing mechanism on the internal volume of the dome switch during actuation of the touch pad are described. These figures are described with respect to the following paragraphs.

FIG. 34 is a perspective drawing of an embodiment of touch pad 116 in the form of a touch pad 201 viewed from the bottom. A top portion of the touch pad 201 is flat and is configured to receive user inputs. The touch pad 201 can be approximately rectangular shaped, although other alternative shapes are certainly possible. The touch pad can include a front edge 221a and back edge 221b.

Figure 35:
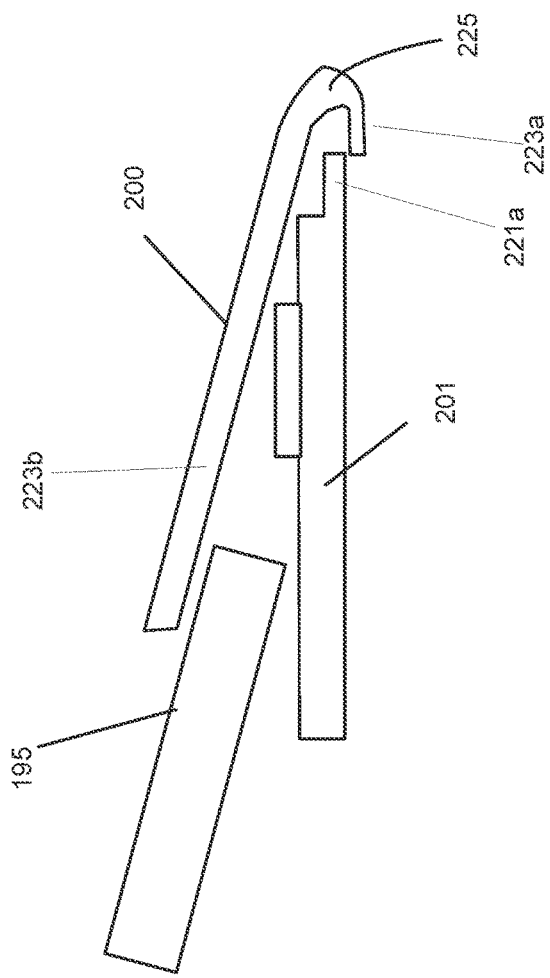
FIG. 35 is a side view of a touch pad and its orientation relative to the body portion of the housing in accordance with the described embodiments.
Figure 36:
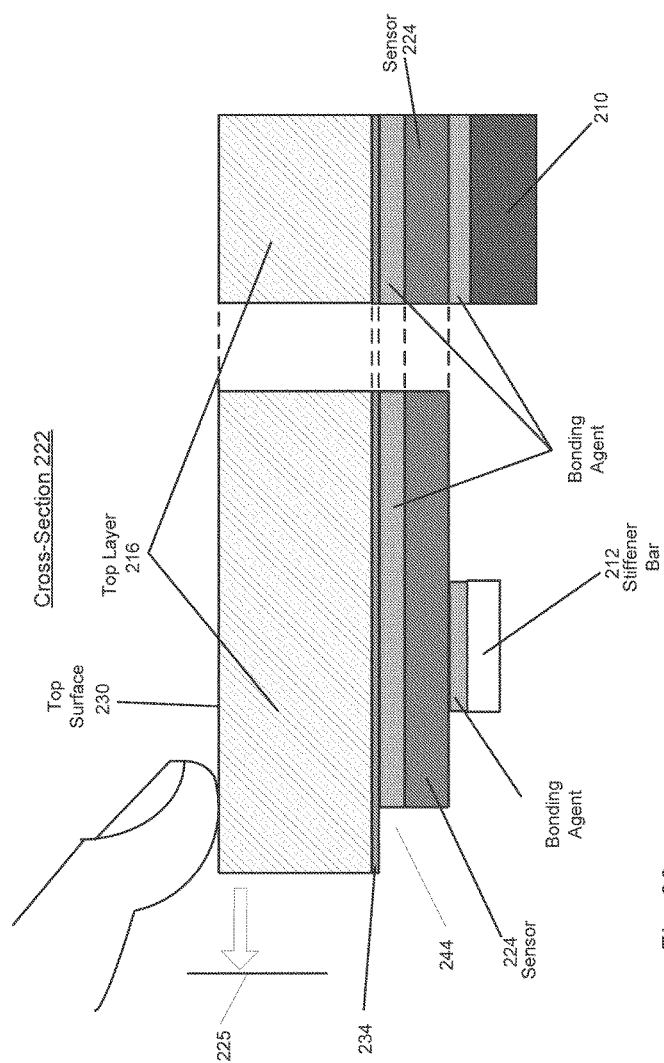
FIG. 36 is a cross-sectional view of the touch pad in accordance with the described embodiments.

As is shown in FIG. 35, when installed in the body portion of the housing, the front edge 221a can be installed near a front 225 of the top case 106. The touch pad 201 can be installed underneath a lip portion 223a of the top case 106 such that is proximately aligned in a parallel manner with the lip portion. A top portion of the touch pad 201 can form a portion of the outer surface of the body portion of the housing. As described above, user inputs can be detested via the top portion of the touch pad 201.

A second portion 223b of the casing can extend at an angle from the front 225 to provide the wedge shape of the body portion of the housing. A portion of a battery 195 can be aligned proximately with the second portion 223b of the top case 106. Thus, the portion of the battery 195 and the touch pad 201 can be orientated at angle relative to one another in their installed position within the top case 106.

Returning to FIG. 34, key board and touch pad processing components 210 can be located near the back edge 221b of the bottom, surface of the touch pad 201 between corner brackets 211. The processing components can be configured to receive signals generated from 1) an actuation of a sensor, such as a membrane associated with the keyboard and 2) an actuation of one or more sensors associated with the touch pad 201, such as sensor 224 and the dome switch 220. The sensor 224 can be configured to detect a position and/or change in position of one or more objects on the top surface of the touch pad, such as the tips of one or more user's fingers. In one embodiment, the sensor can be constructed from a PET material.

The processing components 210 can include a keyboard interface 208. The keyboard interface 208 can be configured to receive a tail 204 (also in another embodiment above as keyboard tail 642) from a keyboard. The tail 204 can be configured to communicate signals generated from user inputs received at the keyboard, such as signals generated via actuation of a membrane sensor associated with the keyboard. In other embodiments, the processing components associated with the keyboard can be provided separately from the touch pad 201 in which case the touch pad may not include keyboard interface 208.

After processing, the signals from the touch pad and/or the keyboard can be sent to the main logic board (MLB) after appropriate processing by processing components 210. Moreover, processing components 210 can include an MLB interface 206 that can be used to allow a connector, such as a flex connector, to be attached between processing components 210 and the MLB. In one embodiment, the connector can be configured to support a USB communication protocol.

The touch pad 201 can include a tactile sensor (shown in FIG. 36 in cross section as sensor 224) for detecting inputs. The sensor 224 can be configured such that it does not extend all the way to front edge 221a of the touch pad 201, which can reduce the thickness of the touch pad near the front edge. An advantage of reducing the thickness of the touch pad 201 in this area is that it can be help the packaging design in the limited volume near the front 225 of top case 106.

In one embodiment, to further reduce the thickness of the touch pad, a portion of the touch pad top layer 216 (that can be formed of, for example, glass) can be removed near the front edge 221a. The touch pad top layer 213 can provide structural support for the touch pad 201. Thus, an amount of touch pad top layer 216 that can be removed may be limited so as to not compromise the overall structural integrity of the touch pad 201.

The touch pad 201 can include wings 214a and 214b. The wings 214a and 214b are located on the sides of the touch pad 201. The wings 214a and 214b can be located on the sides as opposed to near the front edge 221a of the touch pad to allow the touch pad to fit closer to the front 225 of the top case 106 and allow the length of the lip portion 223a to be shortened. If the wings were located on the front of the touch pad, then the front edge 221a would be extended away from the front of the front 225 and a longer lip portion 223a of the top case 106 might be required.

The wings can be used to keep the touch pad 201 in the body portion of the top case 106. An aperture can be provided in the body portion of the top case 106 to expose the top surface of the touch pad 201 for user inputs. The wings can extend beneath structure in the top case 106 that surrounds the aperture. The wings can help prevent the touch pad from extending through the aperture and possibly opening up a gap that exposes an Interior of the body portion.

In one embodiment, the touch pad 201 can include a stiffener bar 212. The stiffener bar can be used to increase the rigidity of the touch pad 201. In one embodiment, the stiffener can be positioned across a bottom surface of the touch pad 201 proximate to the wing locations 214a and 214b. In other embodiments, the stiffener can be positioned at another position. Further, touch pad is not limited to use of a single stiffener and multiple stiffeners can be used. In yet other embodiments, the touch pad can be provided without a stiffener.

In one embodiment, a dome switch 220 is located near the front edge 221a of the touch pad 201. The dome switch 220 can be configured to detect a press actuation of the touch pad 201 towards an interior portion of the top case 106. As described above, after passing through processing 210, a signal generated by the dome switch can be sent to the MLB via MLB interface 206.

In one embodiment, the dome switch 220 can be located near the center portion of the lower surface of the touch pad 201. In other embodiments, the dome switch 220 can be located in an off center position. In yet other embodiments, the touch pad 201 can include multiple dome switches. For example, the touch pad 201 can include two dome switches that are located near the front edge corner.

A sealing mechanism 218 can be provided over the dome switch 220. The sealing mechanism 218 can be used to prevent moisture and other contaminants from penetrating into the dome switch. In one embodiment, the sealing mechanism 218 relatively constant during its actuation. As described above, the aesthetic feel of the dome switch 220 can be affected if the volume of the dome switch 220 is decreased too much during its actuation. Further details of the sealing mechanism 218 and its interaction with the dome switch 220 are described with respect to FIGS. 37a and 37b.

Next, a stacked configuration of the touch pad 201 is described in view of a cross-section taken, at line 222 in FIG. 34. FIG. 36 is a cross-sectional view of the touch pad 201 proximate to line 222. The top surface 230 of touch pad top layer 216 can be configured to receive inputs, such as an input generated when a user's finger comes into a contact with the top surface 230. In one embodiment, the top layer 216 can be about 1.1 mm in thickness.

A cosmetic layer 234, such as an ink layer, can be located beneath the top layer 216. In one embodiment, the ink layer can be about 0.01 mm in thickness. The cosmetic layer 234 can be used to affect the overall appearance of the top layer. For instance, the top layer can be silver colored to give the top layer a metallic appearance. In one embodiment, the pigments for the cosmetic layer 234 can be selected to match another portion of the housing. For instance, the pigments can be selected to match a metallic portion of the housing if the housing is comprised of a metallic material. In another embodiment, the pigments can be selected to match a color of the keys in the keyboard, which can be a different color than other portions of the housing.

A sensor layer 224 can be located below the top layer 230 and the cosmetic layer 234. As described above, the sensor layer 224 can detect inputs received via the top surface 230 of the touch pad. In one embodiment, the sensor layer can be formed from, a plastic material, such as PET. The sensor layer 224 may be about 0.2 mm thick. The sensor layer can be bonded to the cosmetic layer 234 using a bonding agent, such as a pressure sensitive adhesive (PSA). The PSA can be about 0.05 mm in thickness.

As described above, a stiffener bar 212 can be optionally provided to increase the structural rigidity of the touch pad. In particular embodiments, the stiffener bar 212 can be formed from a metallic or plastic material. The stiffener bar 212 can be coupled to the back of the sensor layer 224 using a bonding agent. In one embodiment, the bonding agent can be a PSA.

As described with/respect to FIG. 34, processing components 210 can be located near a back edge of the bottom surface of the touch pad. The processing component 210 can be used, to process signals from components, such as a key board sensor and/or the touch pad sensor. In a particular embodiment, the processing components 210 can be formed on a printed circuit board (PCB). The PCB can be about 0.4 mm in thickness. In one embodiment, the PCB can be mounted to the bottom of the touch pad, such as to a bottom of the sensor layer 224 using a bonding agent.

Figure 37A:
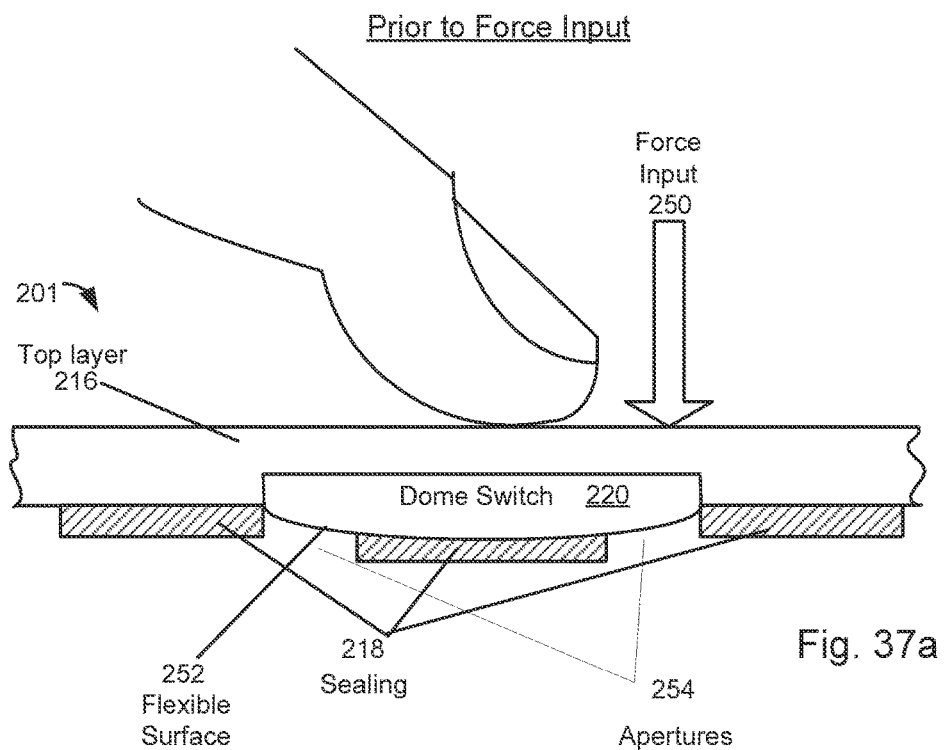
FIGS. 37a and 37b are cross sectional views of a dome switch associated with the touch pad prior to and after a force input to the touch pad in accordance with the described embodiments.
Figure 37B:
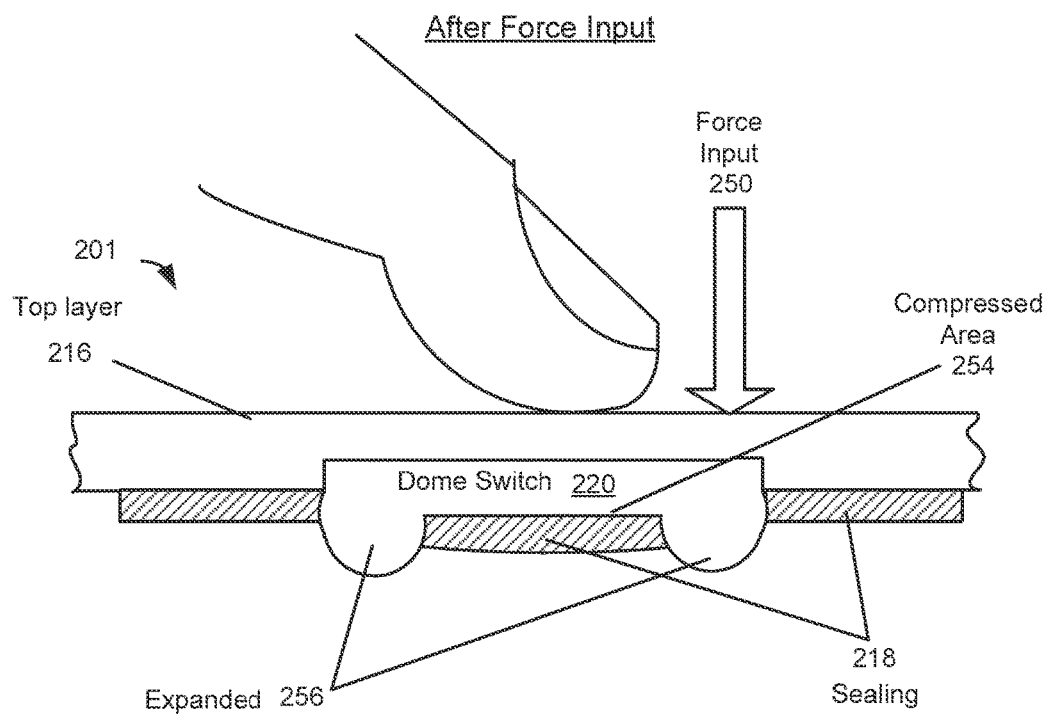
Figure 38:
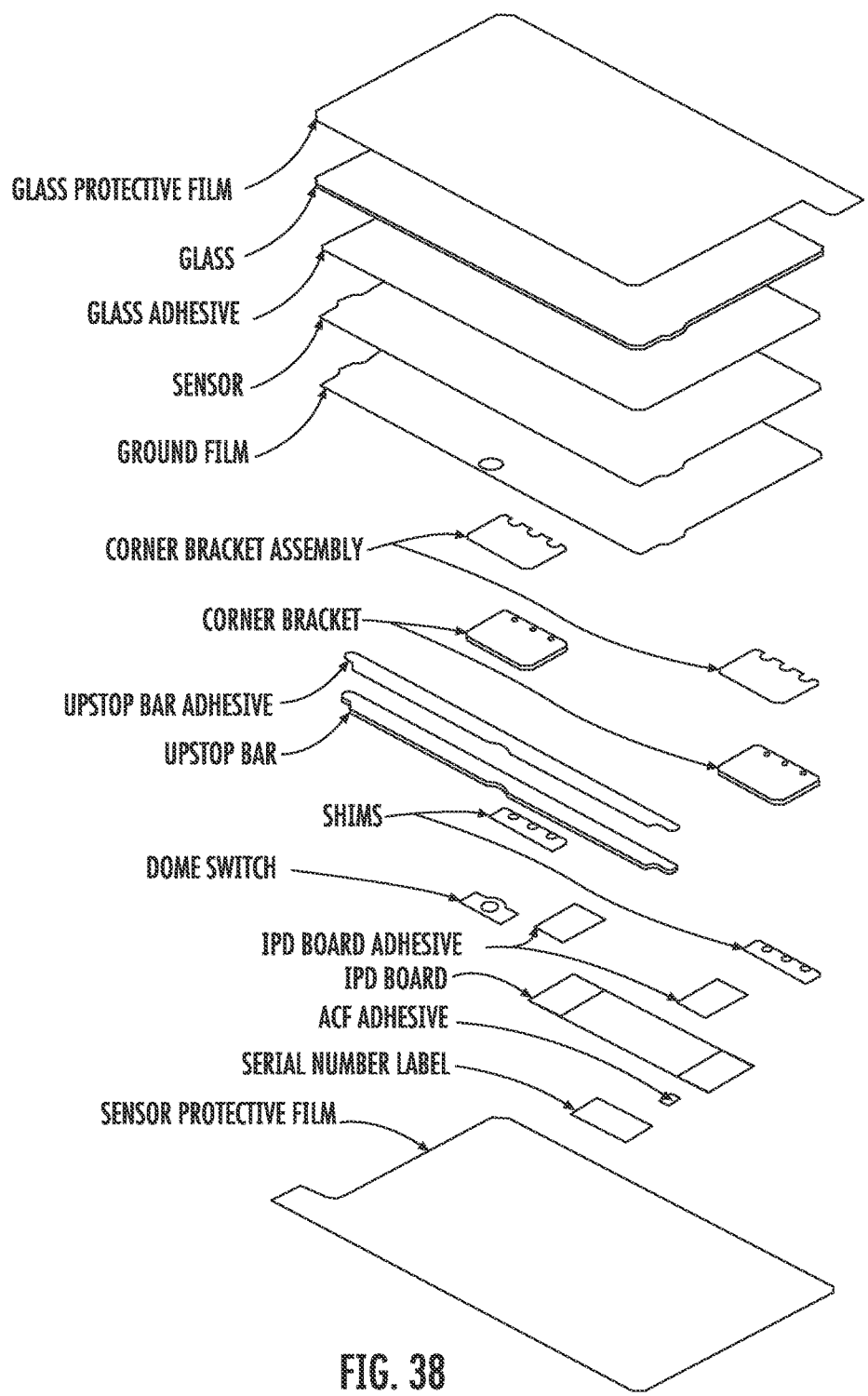
FIG. 38 shows an exploded view of a touch pad in accordance with the described embodiments.

Next, a sealing mechanism 218 for the dome switch 220 shown in FIG. 37a is described. The dome switch 220 can be configured to detect an inward deflection of the touch pad toward an interior of the body portion of the housing. The inward deflection can be generated as a result of a force input 250. The force input 250 can be generated as a result, of user input, such as an input generated when a user presses down on the touch pad. FIG. 37a is a cross sectional view of a dome switch 220 associated with the touch pad prior to a force input 250 and FIG. 37b is a cross sectional view of the touch pad after a force 250.

In FIG. 37a, the dome switch 220 is shown embedded in a recessed surface of the track pad 201. For example, the dome switch can be recessed into a removed portion of the sensor layer and/or the top layer 216. In other embodiments, the dome switch 220 can be mounted beneath the sensor layer and the top layer 216 so that it is not recessed. The dome switch 220 can be mounted using a bonding agent, such as a PSA. The bottom of the dome switch 220 can be orientated toward a bottom of the touch pad 201.

A portion of the dome switch 220 can be constructed from a flexible material. The flexible material can partially enclose a volume of gas within the dome switch. For example, a bottom surface portion 252 can be constructed from a flexible material that partially encloses a gas volume within the dome switch 220. A portion of the dome switch 220 can be covered with a sealing mechanism 218. The sealing mechanism 218 can be formed from a material that is bonded to the bottom surface of the touch pad 201 and a bottom surface of the dome switch 220 via a bonding agent. The sealing mechanism 218 can surround the dome switch 220. In particular embodiments, the sealing mechanism 218 can include one or more apertures. A portion of the bottom surface of dome button can be exposed below the apertures 254 in the sealing mechanism 218.

During actuation of the touch pad, a portion of the sealing mechanism 218 can be in contact with another surface. For instance, when the touch pad 201 is actuated in an inward manner towards an interior of the body portion of the housing, a portion of the sealing mechanism 218 can be pressed against another surface such that the sealing mechanism 218 and the underlying dome switch 220 are compressed. As the dome switch 220 is compressed, the portions 256 of the dome switch 220 below the apertures in the sealing mechanism can expand. For instances, areas 256 of the dome switch 220 can expand. The expanded area can allow the volume of gas contained in the dome switch to remain relatively constant during compression of the dome switch 220. During compression, the volume of the dome switch 220 would decrease and the pressure of the gas inside the sensor would increase.

The additional force that can be needed to compress a fully sealed dome switch can be undesirable from a user perspective, i.e., it can generate an undesirable aesthetic feel to the device. The apertures in the sealing mechanism can 218 allow the volume and hence the pressure within the dome switches 220 to remain relatively constant under compression. Thus, the force to further actuate the touch pad may remain relatively constant daring actuation of the touch pad, which can provide a more desirable aesthetic feel to a user of the touch pad.

FIG. 28 shows an exploded view of touch pad 201 in accordance with the described embodiments.

Reveal Region

Figure 39:
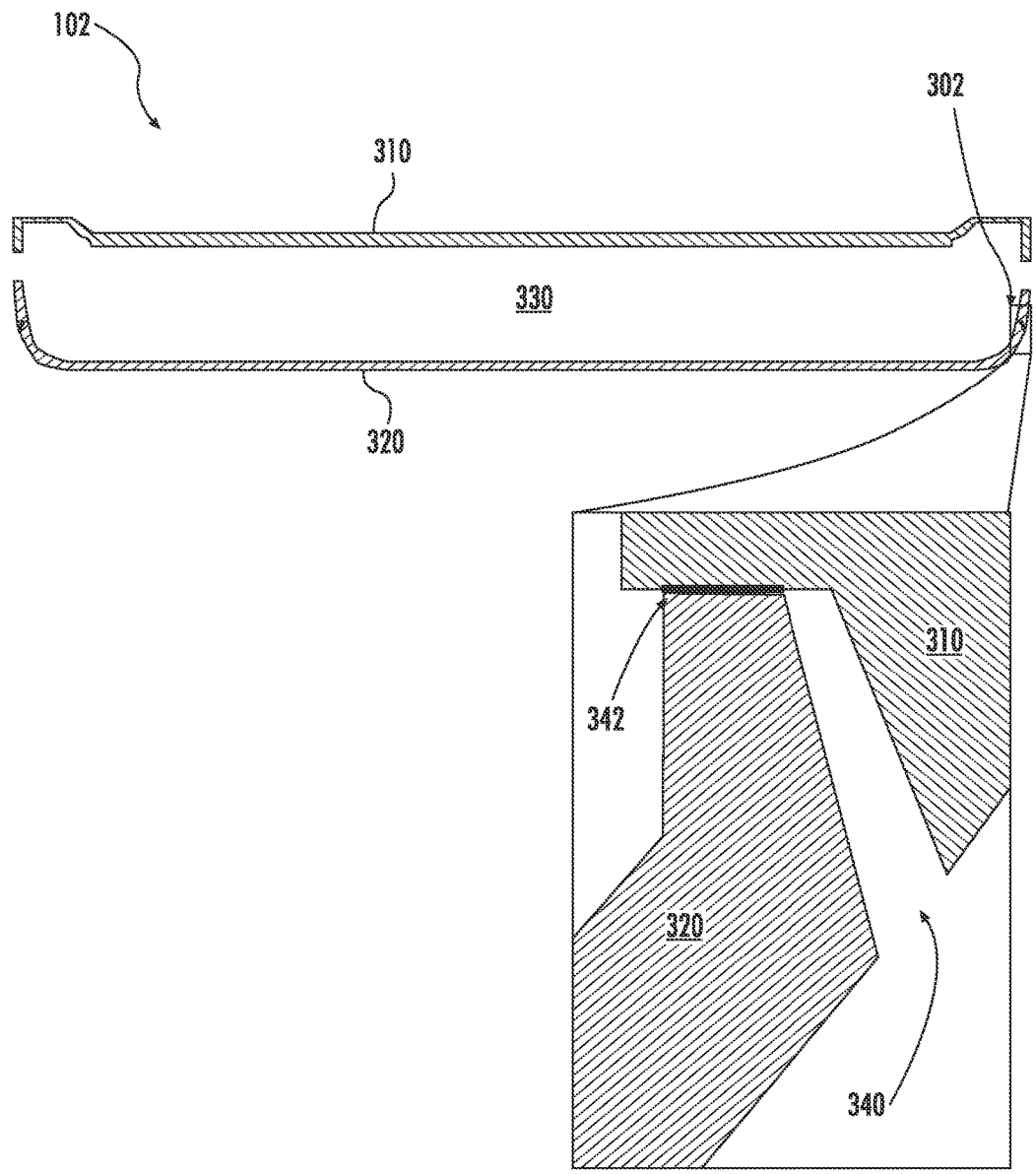
FIG. 39 shows an exemplary outer housing for a portion of a portable computing system is illustrated in side cross-sectional view.

Turning next to FIG. 39, an exemplary outer housing for a portion of a portable computing system is illustrated in side cross-sectional view. Base portion 102 can include a top housing component 310 and a bottom housing component 320 that are assembled together to form an internal cavity or region 330 that contains various internal computing components. The top and bottom housing components 310, 320 can contact each other around an outer circumference of the device at an interface or "reveal" region 302. The general form of the top and bottom housing components 310, 320 at such a reveal region 302 can be substantially similar all along the outer circumference where the top housing meets the bottom housing, although various customizations or anomalies can arise at certain points for certain features or reasons.

As shown in the close-up of reveal region 302, the top housing 310 abuts against the bottom housing 320 along contact area 342. Although it appears as just a line in FIG. 39, it will be readily appreciated that contact area 342 actually represents a region of surface area to surface area contact between the top and bottom housing components 310, 320. The actual location of contact area 342 can shift along the respective foil surface of top component 310 and can vary from device to device, depending upon the actual dimensions of each individual component and device. A gap or "reveal" 340 can exist between the top housing component 310 and bottom housing component 320, with the size of this gap and the offset between the top and bottom housing components potentially varying from device to device or production run to production run in the mass manufacture of device components. As will be readily appreciated, the maximum and minimum dimensions of reveal 340 and any offset between the top and bottom housing components 310, 320 will depend upon various factors, particularly the dimensions and tolerances for the top and bottom housing components themselves.

Figure 40:
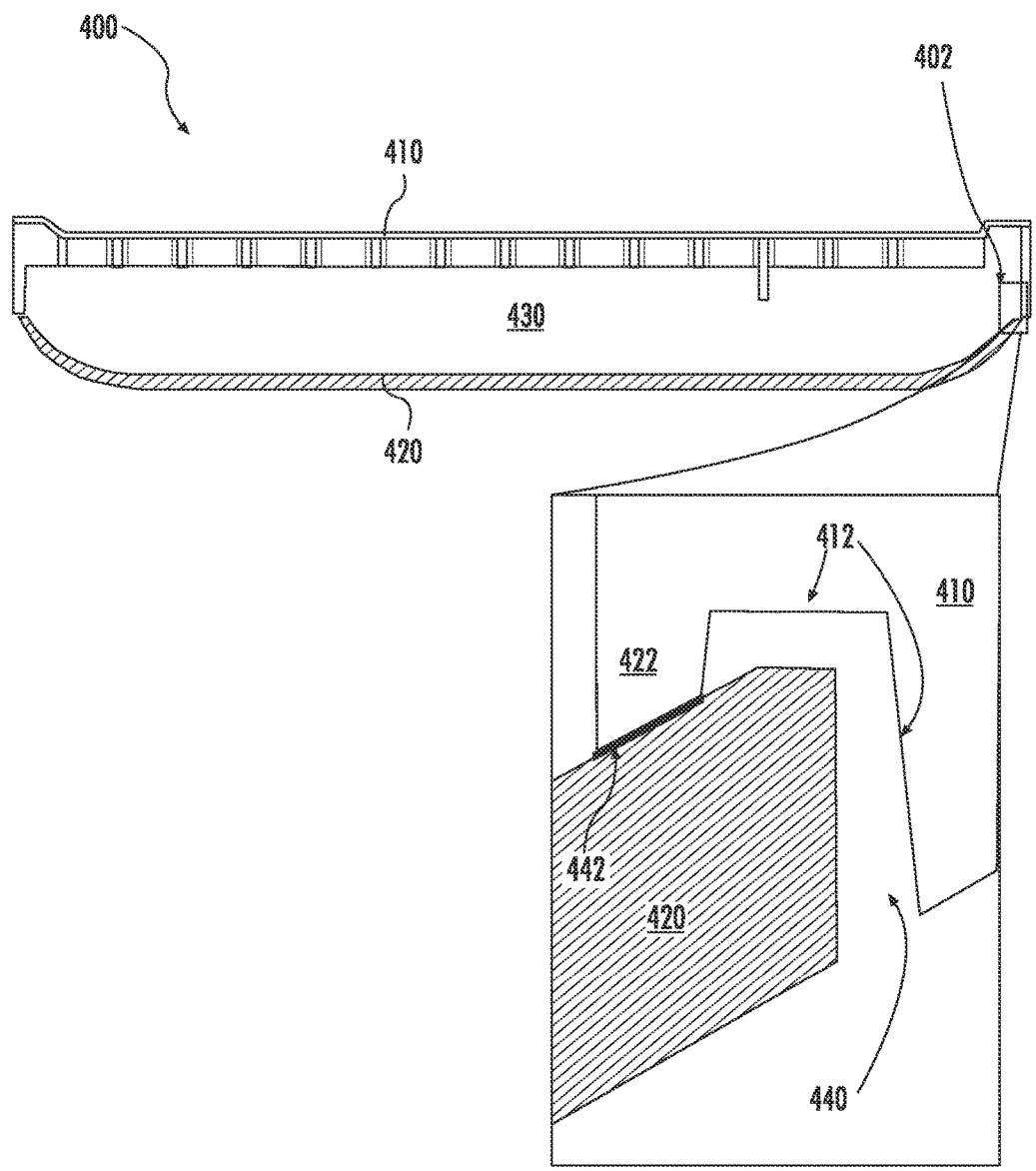
FIG. 40 shows m exemplary alternative outer housing for a portion of a portable computing system according to one embodiment of the present Invention is similarly shown in side cross-sectional view.

Continuing now with FIG. 40, an exemplary alternative outer housing for a portion of a portable computing system according to one embodiment of the present invention is similarly shown in side cross-sectional view. Portable computing system lower portion 400 can similarly include a top housing component 410 and a bottom housing component 420 that are assembled together to form an internal cavity or region 430 that contains various internal computing components. In general, lower portion 400 is part of a portable computing system or electronic device that can process data, and more particularly media data such as audio, video, images, and the like. By way of example, the respective portable computing, system can generally correspond to a device that can perform as a music player, game player, video player, media center, laptop computer, tablet computer, handheld electronic device and/or the like, internal cavity or region 430 can be configured to enclose any suitable number of internal components, such as, for example, integrated circuits that can take the form of chips, chip sets, or modules, any of which can be surface mounted to a printed circuit board or other support structure. Internal components can include a microprocessor, memory, battery, and various support circuits and so on.

The top and bottom housing components 410, 420 can contact each other around an outer circumference of the device at an interface or reveal region 402, the details of which are somewhat different than the reveal region 302 set forth above. As in the above reveal region 302, however, the general form of the top and bottom housing components 410, 420 at reveal region 342 can be substantially similar all along the cotter circumference of the device where the top housing meets the bottom housing, although various customizations or anomalies can arise at certain points along the interface region for certain features or reasons.

As shown in the close-up of reveal region 402, top housing 410 similarly abuts against the bottom housing 420 along a contact area 442. Again, it will be readily appreciated that contact area 442 represents a region of surface area to surface area contact between the top and bottom housing components 410, 420, despite its representation in the cross-sectional illustration as just a line. Unlike the former and simpler interface region, contact area 442 generally defines a plane is at a non-zero angle with respect to a horizontal plane generally defined by the lower portion 400 or overall portable computing device.

In addition, the interfacing or contacting regions of top housing component 410 and bottom housing component 420 are a bit more complex, which results in a gap or reveal 440 that tends to be smaller and more consistent than the gap 340 in the foregoing version with respect to the mass production of portable computing systems. In particular, top housing component 410 has a trough 412 that is formed along its interfacing edge, with a shoulder 422 that rises along a back portion of the trough. As shown, the shoulder 422 has at its top surface an interfacing edge or first contact surface that contacts an upper surface or second contact surface of the bottom housing component 420 at contact area 442.

The design of both reveal regions 302, 402 generally allow for variances in the actual dimensions from component to component and device to device in a muss production or interchangeable parts setting without unduly compromising the aesthetic integrity and appeal of the overall product. The design of the trough 412 and shoulder 422 to bottom housing component interface 442 between the top and bottom housing components 410, 420 of reveal region 402 is superior, however, in that both the overall maximum size of and the variances in gap 440 and any resulting offset between housing components are reduced. That is, while some amount of gap or reveal 440 can generally be expected when different parts having varying dimension tolerances are assembled in a mass production environment the trough 412 and shoulder 422 to bottom housing interfacing design disclosed herein reduces the overall size and variances in the gap without requiring any tightening in the dimensional tolerances of top and bottom housings 410, 420.

Figure 41:
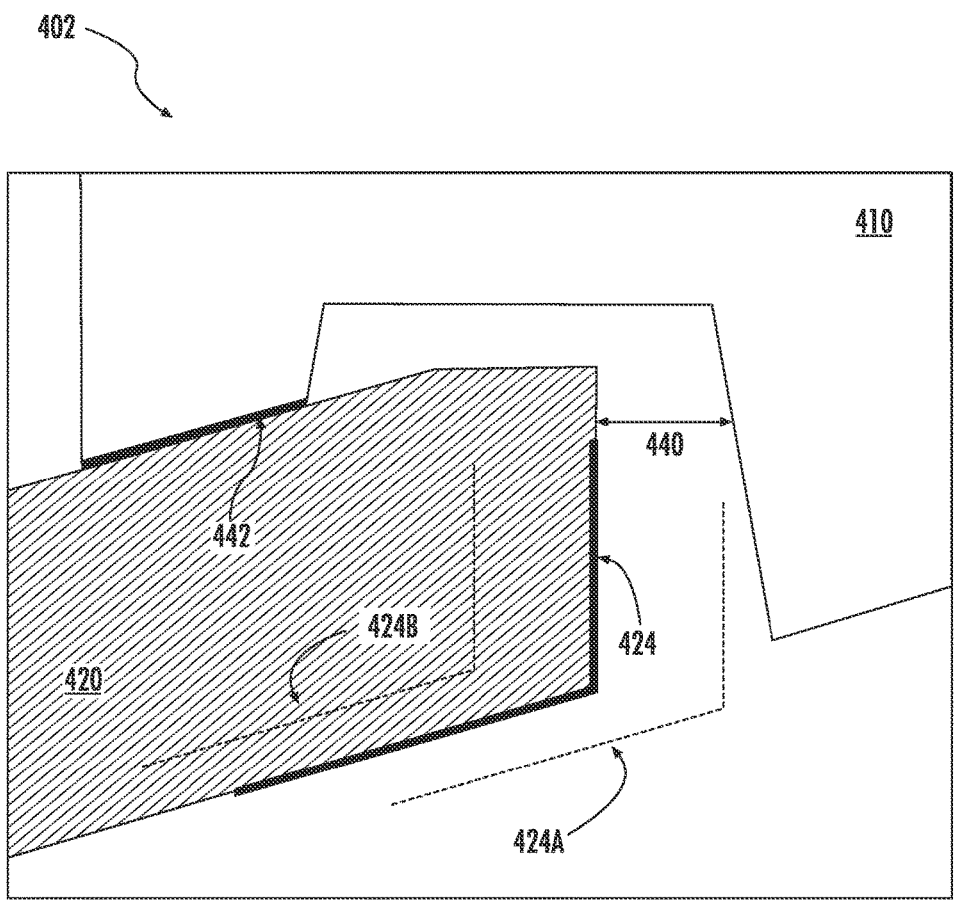
FIG. 41 illustrates in close-up side cross-sectional view an exemplary shoulder to trough interface region of the dousing components of FIG. 13 according to one embodiment of the present invention.

FIG. 41 illustrates in close-up cross-sectional view an exemplary shoulder to trough interface region of the housing components of FIG. 40 according to one embodiment of the present invention. Again, reveal region 402 depicts a top housing component 410 having a trough and a shoulder, as well as a bottom housing component 420 having an upper surface that interfaces with the top surface of the shoulder. Actual contact between the top and bottom housing components 410, 420 is along contact area 442. As will be readily appreciated, the actual location of the leading/visible edge 424 of bottom housing 420 depends on the actual size and dimensions (e.g., length, height, thickness, etc.) of the top and bottom housing components 410, 420. In some part combinations, leading edge 424 will be located right in the middle of a tolerance spectrum resulting in gap or reveal 440.

Other part combinations with different parts may have slightly different dimensions that still remain within manufacturing tolerances. Such combinations that still include parts that are in tolerance could result in a leading edge placement that is advanced as far as leading edge profile 424A, or alternatively could result in a leading edge placement that is recessed as far as leading edge profile 424B. As will be understood, advanced leading edge profile 424A results in a smaller reveal 440 and an offset where the outer surface of bottom housing component 420 is raised above the surface of top housing component 410, while recessed leading edge profile 424B results in a greater reveal 440 and an offset where the outer surface of the bottom housing is sunk below the outer surface of the top housing. As will also be readily appreciated, varying one or more dimensions in the size of the top housing component or bottom housing component can result in a different portion of the upper contact surface of the bottom case contacting the contact surface of the shoulder along contact area 422.

Given the design of the trough and shoulder arrangement, however, the maximum, minimum and consistency values for the gap or reveal 440 and offset are improved without any change in the part or component tolerances. Again, the reduction in the maximum and minimum gap and effect sizes results in a final product that is more consistent from device to device and between production runs, which results in improved aesthetic qualities and perceptions.

Figure 42A:
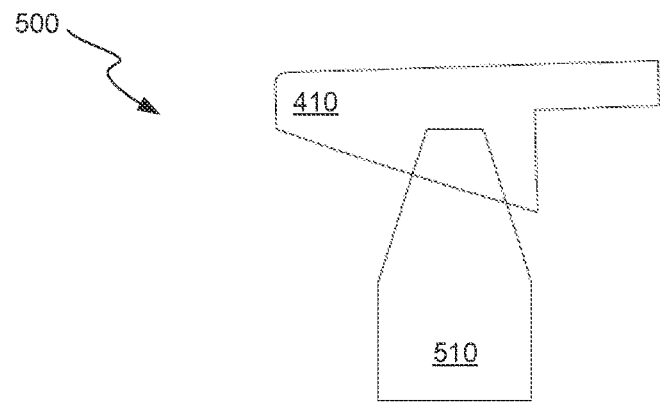
FIGS. 42A through 42C, on exemplary way of forming a trough in a housing component interface region are provided according to one embodiment of the described embodiments.
Figure 42B:
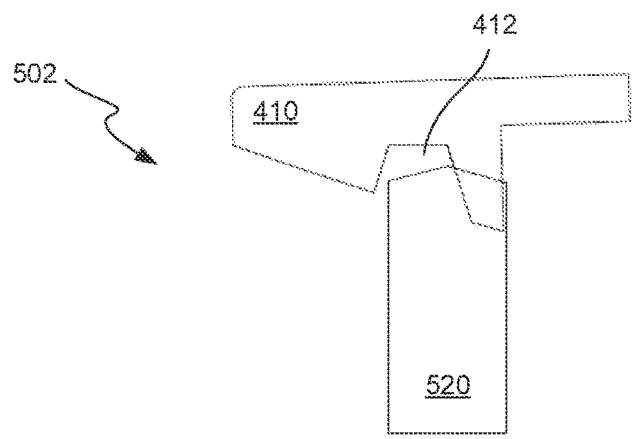
Figure 42C:
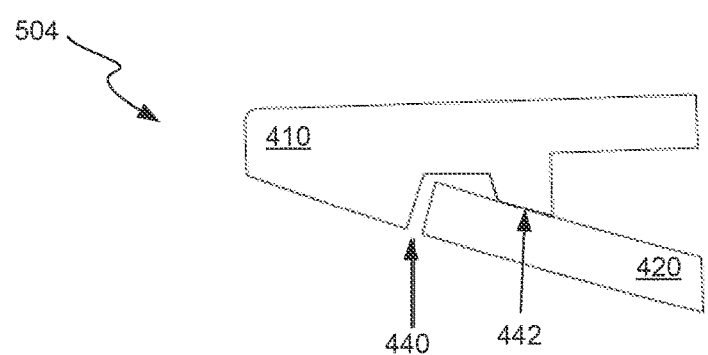

Moving next to FIGS. 42A through 42C, on exemplary way of forming a trough and shoulder in a housing component interface region is provided according to one embodiment of the present invention. Beginning with FIG. 42A, an exemplary initial tooling arrangement designed to initiate the formation of a trough in a top housing component is shown in side cross-sectional view. Initial tooling arrangement 500 includes a partially formed top housing component 410 and a suitable cutting or shaping tool 510. Cutting tool 510 can be any of a number of tools, such as a saw, drill, router or the like. As shown, cutting tool 510 can be used to form a general trough or trough in a region of the top housing component 410.

After the initial trough is formed, FIG. 42B illustrates an exemplary secondary tooling arrangement designed to finish the trough and shoulder formation. Subsequent tooling formation 502 includes the top housing component 410 with the initially formed trough and a suitable secondary cutting or shaping tool 520. Secondary tool 520 can be used to shave, cut or otherwise remove an extended portion on the shoulder, such that a suitable interfacing surface is formed at the top surface of the shoulder. This interfacing surface is important, in that this is the surface that will eventually form the contact area 442 with the bottom housing component. Similar to the foregoing, secondary tool 520 can be any of a number of tools, such as a saw, drill, router, plane, blade or the like.

Lastly, FIG. 42C illustrates in side cross-sectional view the trough and shoulder of the top housing component of FIG. 42B as contacting the surface of a suitably formed bottom housing component. Formation 504 includes a top housing component 410 and a bottom housing component 420 having suitable interfacing regions. In particular, top housing 410 has finished trough and shoulder regions and is configured to contact bottom housing component 420 at contact area 442. As noted above, this results in a gap or reveals 440 that are smaller and more consistent in size from device to device.

Figure 43:
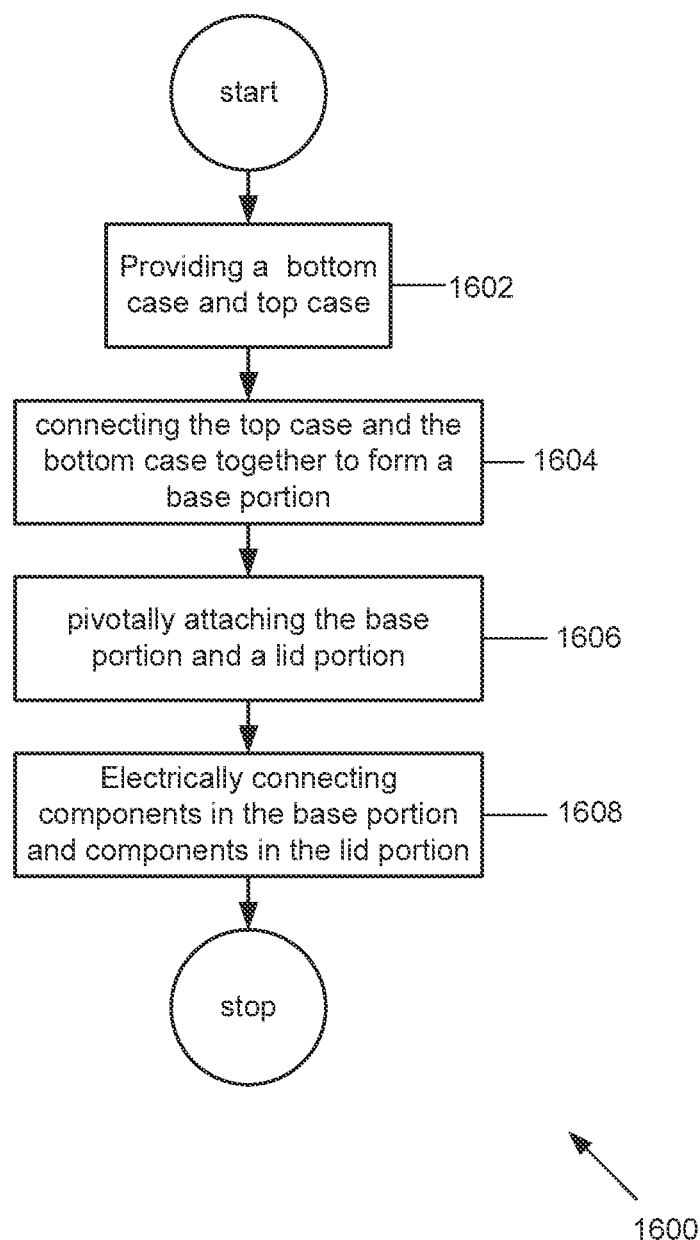
FIG. 43 shows a flowchart detailing a process in accordance with the described embodiments.

FIG. 43 shows a flowchart detailing a process in accordance with the described embodiments. Process 1600 can start at 1602 by providing a base portion that includes at least a wedge shaded top case having a trough formed at an interfacing edge thereof, wherein the trough includes a raised shoulder portion having a first contact surface, and a bottom case. At 1604, the bottom case is coupled to the top case to form a complete housing for at least a portion of the portable computing device for enclosing at least a plurality of operational components and a plurality of structural components. At 1606, the base portion is pivotally connected to a lid portion by a hinge assembly. In the described embodiments, the lid portion has at a plurality of components at least one of which is a display. At 1608, at least some of the components in the lid portion are electrically connected to operational components in the based portion by way of or more electrical conductors that run through the hinge assembly.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A portable computing device, comprising:
    a body comprising a first end and a tapered second end narrower than the first end, the body having an inclined top surface and configured to support and enclose a plurality of operational components, the body further configured to present to an end user one or more user input components at an incline in conformance with the inclined top surface of the portable computing device, the one or more user input components comprising:
    a keyboard assembly, the keyboard assembly comprising a keyboard having a plurality of pressable key pads;
    a touch pad located within a touch pad opening in the body in proximity to the tapered second end and comprising:
        a glass layer defining:
            a top surface adapted to accept touch inputs from the end user; and
            a front edge adjacent a lip defined by a front side of the touch pad opening;
        a cosmetic layer located below the glass layer; and
        a sensor layer bonded to the cosmetic layer and adapted to detect touch inputs at the top surface of the glass layer, wherein the front edge of the glass layer and an edge of the sensor layer define a plan accordance with an inclined surface of the tapered second end of the body;
    a bottom cover, wherein the body and the bottom cover are secured to each other by way of a plurality of fasteners to form a complete housing for at least a portion of the portable computing device; and
    a lid portion comprising a display assembly arranged to present visual content.

2. The portable computing device as recited in claim 1, further comprising:
    a hinge assembly having a size and shape that fits within the first end of the body, the hinge assembly arranged to pivotally connect the complete housing and the lid portion, wherein one or more electrical conductors electrically connect at least some of the operational components in the complete housing to the display assembly, at least one of the electrical conductors being carried in the hinge assembly.

3. The portable computing device as recited in claim 1, wherein the body comprises a trough and a shoulder formed at an interfacing edge of the body, wherein the shoulder includes a raised portion having a first contact surface.

4. The portable computing device of claim 3, wherein the bottom cover includes a second contact surface having a portion thereof that contacts the first contact surface, and a leading edge that is spaced apart from a first wall of the trough, wherein the area of contact between the first and second contact surfaces defines a plane that is non-parallel to a horizontal plane generally defined by the portable computing device.

5. The portable computing device of claim 4, wherein the leading edge of the bottom cover is spaced apart from a bottom portion of the trough.

6. The portable computing device of claim 5, wherein the body directly contacts the bottom cover only at the area of contact between the first and second contact surfaces.

7. The portable computing device of claim 6, wherein the trough includes the first wall, a bottom portion, and a second wall, with both walls rising above the bottom portion to form the trough, and the second wall forming the shoulder.

8. The portable computing device of claim 7, wherein the trough and shoulder are formed around a circumference of the body at the interfacing edge.

9. The portable computing device as recited in claim 1 wherein at least one of the operational components is a solid state memory module, the solid state memory module comprising:
    a substrate having a top side and a bottom side; and
    a first plurality of memory devices arranged linearly on the top side of the substrate.

10. The portable computing device as recited in claim 9, the solid state module further comprising:
    a second plurality of memory devices arranged linearly on the bottom side of the substrate;
    a controller linearly arranged in accordance with the first and second plurality of memory devices and arranged to provide control signals to the first and second plurality of memory devices; and
    a set of contacts located along one edge of the substrate, the contacts being adapted to interface with a high speed connector coupled to a motherboard of the portable computing device, where the set of contacts are separated into at least two groups by a physical gap located between the separated groups.

11. The portable computing device as recited in claim 10, the high speed connector comprising:
a plurality of contacts each comprising:
a first portion used to make electrical contact with a corresponding contact on a printed circuit board; and
a second portion aligned with the first portion arranged to make contact with a corresponding one of the set of contacts of the solid state memory module when the high speed connector completes a high speed communication channel between the solid state memory module and components on the printed circuit board.

12. The portable computing device as recited in claim 11 wherein the high speed connector further comprises:
an insulative shield arranged to cover at least a top portion and a back portion of the high speed connector and having a front side opening for receiving at least the portion of the solid state memory module including the set of contacts and at least one opening for visually determining that the portion of the solid state memory module including the set of contacts is correctly inserted into the high speed connector, wherein
when the insulative shield is connected to a ground contact, the insulative shield acts as a ground plane improving signal integrity between the solid state memory module and components on a printed circuit board connected thereto.

* * * * *

UNITED STATES PATENT AND TRADEMARK OFFICE
CERTIFICATE OF CORRECTION

PATENT NO. : 9,829,932 B2  
APPLICATION NO. : 14/593930  
DATED : November 28, 2017  
INVENTOR(S) : Degner et al.

It is certified that error appears in the above-identified patent and that said Letters Patent is hereby corrected as shown below:

In the Claims

In Column 26, at Line 7, Claim 1, delete "plan" and insert --plane in.--

Signed and Sealed this
Thirteenth Day of February, 2018

Andrei Iancu
*Director of the United States Patent and Trademark Office*